(12) United States Patent
Yamazaki et al.

(10) Patent No.: US 9,059,247 B2
(45) Date of Patent: Jun. 16, 2015

(54) METHOD FOR MANUFACTURING SOI SUBSTRATE AND METHOD FOR MANUFACTURING SEMICONDUCTOR DEVICE

(75) Inventors: Shunpei Yamazaki, Setagaya (JP); Hideto Ohnuma, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 182 days.

(21) Appl. No.: 12/076,994

(22) Filed: Mar. 26, 2008

(65) Prior Publication Data
US 2008/0286910 A1 Nov. 20, 2008

(30) Foreign Application Priority Data
May 18, 2007 (JP) .................................. 2007-133546

(51) Int. Cl.
| | |
|---|---|
| *H01L 21/30* | (2006.01) |
| *H01L 21/762* | (2006.01) |
| *H01L 27/12* | (2006.01) |
| *H01L 29/66* | (2006.01) |

(52) U.S. Cl.
CPC ...... *H01L 21/76254* (2013.01); *H01L 27/1214* (2013.01); *H01L 27/1266* (2013.01); *H01L 29/66772* (2013.01)

(58) Field of Classification Search
CPC ...................... H01L 21/76254; H01L 27/1214; H01L 27/1266; H01L 29/66772
USPC .......... 438/458, 464, 154, 164, 459; 257/347, 257/E21.151, E21.561, E21.567–E21.57
See application file for complete search history.

(56) References Cited

U.S. PATENT DOCUMENTS

| | | | |
|---|---|---|---|
| 5,374,564 A | 12/1994 | Bruel | |
| 5,618,739 A * | 4/1997 | Takahashi et al. | ............ 438/158 |

(Continued)

FOREIGN PATENT DOCUMENTS

| | | |
|---|---|---|
| EP | 0849788 A | 6/1998 |
| JP | 11-145438 A | 5/1999 |

(Continued)

OTHER PUBLICATIONS

Wolf et al., Silicon Processing for the VLSI Era, vol. 1: Process Technology, 1986 by Lattice Press, p. 194.*

(Continued)

*Primary Examiner* — Daniel Shook
(74) *Attorney, Agent, or Firm* — Eric J. Robinson; Robinson Intellectual Property Law Office, P.C.

(57) ABSTRACT

A method for manufacturing an SOI substrate with favorable adherence without high-temperature heat treatment being performed in bonding, and a semiconductor device using the SOI substrate and a manufacturing method thereof are proposed. An SOI substrate and a semiconductor device can be manufactured by forming a single-crystalline silicon substrate with a thickness of 50 μm or less in which a brittle layer is formed; forming a supporting substrate having an insulating layer over a surface; activating at least one of the surfaces of the single-crystalline silicon substrate and the insulating layer by exposure to a plasma atmosphere or an ion atmosphere; and bonding the single-crystalline silicon substrate and the supporting substrate with the insulating layer interposed therebetween.

26 Claims, 22 Drawing Sheets

(56) References Cited

U.S. PATENT DOCUMENTS

| | | | |
|---|---|---|---|
| 6,100,166 A | 8/2000 | Sakaguchi et al. | |
| 6,127,702 A | 10/2000 | Yamazaki et al. | |
| 6,245,645 B1 * | 6/2001 | Mitani et al. | 438/455 |
| 6,271,101 B1 | 8/2001 | Fukunaga | |
| 6,335,231 B1 | 1/2002 | Yamazaki et al. | |
| 6,335,258 B1 * | 1/2002 | Aspar et al. | 438/406 |
| 6,372,609 B1 | 4/2002 | Aga et al. | |
| 6,380,046 B1 | 4/2002 | Yamazaki | |
| 6,388,652 B1 | 5/2002 | Yamazaki et al. | |
| 6,534,382 B1 | 3/2003 | Sakaguchi et al. | |
| 6,583,440 B2 | 6/2003 | Yasukawa | |
| 6,602,761 B2 | 8/2003 | Fukunaga | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,818,921 B2 | 11/2004 | Yasukawa | |
| 6,875,633 B2 | 4/2005 | Fukunaga | |
| 6,908,797 B2 | 6/2005 | Takano | |
| 7,037,752 B2 | 5/2006 | Kuwabara et al. | |
| 7,112,514 B2 | 9/2006 | Yasukawa | |
| 7,176,525 B2 | 2/2007 | Fukunaga | |
| 7,199,024 B2 | 4/2007 | Yamazaki | |
| 7,256,776 B2 | 8/2007 | Yamazaki et al. | |
| 7,300,853 B2 * | 11/2007 | Joly et al. | 438/406 |
| 7,419,884 B2 | 9/2008 | Kerdiles | |
| 7,498,234 B2 * | 3/2009 | Aspar et al. | 438/455 |
| 7,508,034 B2 | 3/2009 | Takafuji et al. | |
| 7,601,217 B2 * | 10/2009 | Faure et al. | 117/92 |
| 7,642,112 B2 | 1/2010 | Atoji et al. | |
| 2003/0203547 A1 | 10/2003 | Sakaguchi et al. | |
| 2004/0004271 A1 | 1/2004 | Fukuda et al. | |
| 2004/0104424 A1 | 6/2004 | Yamazaki | |
| 2005/0009252 A1 | 1/2005 | Yamazaki et al. | |
| 2005/0115642 A1 * | 6/2005 | Fukuda et al. | 148/33.5 |
| 2005/0260800 A1 | 11/2005 | Takano | |
| 2006/0270236 A1 | 11/2006 | Kusumoto et al. | |
| 2007/0032044 A1 * | 2/2007 | Henley | 438/459 |
| 2007/0087488 A1 | 4/2007 | Moriwaka | |
| 2007/0108510 A1 | 5/2007 | Fukunaga | |
| 2007/0117406 A1 | 5/2007 | Saito | |
| 2007/0173000 A1 | 7/2007 | Yamazaki | |
| 2007/0184632 A1 | 8/2007 | Yamazaki et al. | |
| 2007/0281440 A1 * | 12/2007 | Cites et al. | 438/458 |
| 2007/0291022 A1 | 12/2007 | Yamazaki et al. | |
| 2009/0095956 A1 | 4/2009 | Takafuji et al. | |
| 2012/0012972 A1 | 1/2012 | Takafuji et al. | |

FOREIGN PATENT DOCUMENTS

| | | |
|---|---|---|
| JP | 2001-503568 A | 3/2001 |
| JP | 2002-170942 A | 6/2002 |
| JP | 2004-039735 A | 2/2004 |
| JP | 2004-134675 A | 4/2004 |
| JP | 2004-320050 | 11/2004 |
| JP | 2005-101630 A | 4/2005 |
| JP | 2006-080314 A | 3/2006 |
| JP | 2008-535230 | 8/2008 |
| WO | WO-2006/111533 | 10/2006 |

OTHER PUBLICATIONS

Wolf et al., Silicon Processing for the VLSI Era, vol. 1 Process Technology, 1986 by Lattice Press, p. 194.*

Wolf, S., Silicon Processing for the VLSI Era, vol. 2: Process integration 1990 by Lattice Press, pp. 327-336.*

Sullivan et al., "P-220L: Late-News Poster: Layer-Transfer of Silicon Single-Crystal Films on Large-Area Glass Substrates for Mobile Display Applications," SID Digest '06, Sid International Symposium Digest of Technical Papers, 2006, pp. 280-282.

* cited by examiner

FIG. 22

| Accelerating voltage | Hydrogen atom ratios (X:Y) | Hydrogen ion species ratios (X:Y/3) |
|---|---|---|
| 80keV | 1:44.1 | 1:14.7 |
| 60keV | 1:42.5 | 1:14.2 |
| 40keV | 1:43.5 | 1:14.5 |

METHOD FOR MANUFACTURING SOI SUBSTRATE AND METHOD FOR MANUFACTURING SEMICONDUCTOR DEVICE

BACKGROUND OF THE INVENTION

1. Field of the Invention

The present invention relates to methods for manufacturing SOI substrates, semiconductor devices formed using the SOI substrates, and methods for manufacturing the semiconductor devices. Note that "semiconductor device" in this specification refers to general devices that can function by use of semiconductor characteristics.

2. Description of the Related Art

A variety of research related to silicon on insulator (SOI) technology is being carried out because integrated circuits that are manufactured using SOI substrates formed of a single-crystalline silicon film on an insulating surface have advantages that cannot be obtained with integrated circuits that are manufactured using bulk silicon substrates.

For SOI technology, for example, separation by implanted oxygen (SIMOX) technology by which oxygen ions are implanted in a single-crystalline silicon substrate to form a buried oxide layer; bonding SOI technology by which two silicon substrates are bonded to each other with a silicon oxide film interposed therebetween; ELTRAN (registered trademark) technology in which selective etching of a porous silicon layer is used; and the like have been disclosed.

Of these technologies, bonding SOI technology has been attracting attention because therewith an SOI layer with high crystallinity can easily be formed over substrates other than silicon substrates (quartz substrates, ceramic substrates, and the like, for example). However, in manufacture of a bonding SOI substrate, there are problems in that deterioration in quality due to contamination of the SOI layer, warping of the substrate, and the like occur, which adversely affects device characteristics.

Thus, for solving these kinds of problems, technology for manufacture of bonding SOI substrates, by which two wafers are directly bonded to each other, has been proposed (for example, in Reference 1: Japanese Published Patent Application No. 2004-320050). In Reference 1, a method for manufacturing an SOI substrate has been disclosed, in which a wafer having a structure in which a silicon oxide layer, a silicon nitride layer, and a polycrystalline silicon layer are stacked in order over a single-crystalline silicon layer to be an active layer and a wafer for a supporting substrate, which is provided separately, are washed with a solution so that the surface of each of the wafers is activated; the surfaces of the two wafers are directly bonded to each other; heat treatment is performed to bond the wafers; and an SOI substrate is formed by grinding and polishing of the single-crystalline silicon layer to be an active layer.

SUMMARY OF THE INVENTION

However, with conventional methods, there is a need for heat treatment to be performed at a high temperature of from 800° C. to 1100° C. in bonding of the two substrates and a substrate with high resistance to heat, such as a silicon substrate, must be used for the supporting substrate; thus, there is a problem in that the manufacturing cost is increased. Furthermore, with conventional methods, because a thin single-crystalline silicon layer is manufactured by grinding and polishing of a single-crystalline silicon layer after bonding, there are problems in that controlling a film thickness and controlling the uniformity of a film thickness are difficult.

The present invention is technology used to solve these kinds of problems, and an object of the present invention is to provide a method for manufacturing a semiconductor layer with a high level of adherence without any high-temperature heat treatment being performed in the bonding of substrates. Another object of the present invention is to provide a semiconductor device in which the SOI substrate is used and a manufacturing method of the semiconductor device.

An SOI substrate can be manufactured by forming a brittle layer and a single-crystalline semiconductor layer over the brittle layer in a single-crystalline semiconductor substrate; forming a first insulating layer over the single-crystalline semiconductor layer; thinning the single-crystalline semiconductor substrate to a thickness of 50 µm or less; forming a supporting substrate having a second insulating layer over a surface; bonding the single-crystalline semiconductor substrate and the supporting substrate to each other with the first insulating layer and the second insulating layer interposed therebetween; and separating the single-crystalline semiconductor layer from the single-crystalline semiconductor substrate at the brittle layer to form a thin single-crystalline semiconductor layer over the supporting substrate with the first insulating layer and the second insulating layer interposed therebetween. Note that at least one of the surfaces of the first insulating layer and the second insulating layer may be exposed to a plasma atmosphere or an ion atmosphere to be activated. Further, the first insulating layer or the second insulating layer is not necessarily provided.

A semiconductor device can be manufactured by forming a brittle layer and a single-crystalline semiconductor layer over the brittle layer in a single-crystalline semiconductor substrate; forming a first insulating layer over the single-crystalline semiconductor layer; thinning the single-crystalline semiconductor substrate to a thickness of 50 µm or less; forming a supporting substrate having a second insulating layer over a surface; bonding the single-crystalline semiconductor substrate and the supporting substrate to each other with the first insulating layer and the second insulating layer interposed therebetween; separating the single-crystalline semiconductor layer from the single-crystalline semiconductor substrate at the brittle layer to form a thin single-crystalline semiconductor layer over the supporting substrate with the first insulating layer and the second insulating layer interposed therebetween; forming a third insulating layer over the thin single-crystalline semiconductor layer; forming a gate electrode over the third insulating layer; introducing impurities to the thin single-crystalline semiconductor layer using the gate electrode as a mask; forming a fourth insulating layer over the gate electrode; forming a contact hole which reaches the thin single-crystalline semiconductor layer in the fourth insulating layer; and forming a conductive layer electrically connected to the thin single-crystalline semiconductor layer through the contact hole over the fourth insulating layer. Note that the at least one of the surfaces of the first insulating layer and the second insulating layer may be exposed to a plasma atmosphere or an ion atmosphere to be activated. Further, the first insulating layer or the second insulating layer is not necessarily provided.

A gas used for the plasma atmosphere can be a gas of a single element such as oxygen, nitrogen, hydrogen, a halogen gas, or a rare gas, a compound gas except a silane based gas, or a mixed gas thereof. Note that ions having energy of 20 eV or more can be used for the ion atmosphere.

In the present invention, because a bonding force used to bond substrates is applied to the surfaces of the substrates and the two substrates are superposed on each other, strong bonding can be performed without any high-temperature heat treatment being performed. Consequently, there is no need to use an expensive substrate that has high resistance to heat, and an inexpensive substrate such as a glass substrate can be used; thus, a reduction in manufacturing cost can be achieved. Furthermore, by use of a silicon film that contains oxygen or nitrogen as an insulating film interposed between the supporting substrate and the single-crystalline silicon layer, contamination due to impurities from the substrate into the single-crystalline silicon layer can be prevented.

Further, the present invention has a feature that a flexible single-crystalline silicon substrate with a thickness of 50 μm or less is used. Therefore, the shape of the surface of the single-crystalline silicon substrate can be fitted to the warped surface of the supporting substrate on which the single-crystalline silicon substrate is superposed, whereby a stronger bond can be formed at the bonding interface.

BRIEF DESCRIPTION OF THE DRAWINGS

FIG. 22 is a list of ratios of fitting parameters (hydrogen atom ratios and hydrogen ion species ratios).

DETAILED DESCRIPTION OF THE INVENTION

Figure 1:
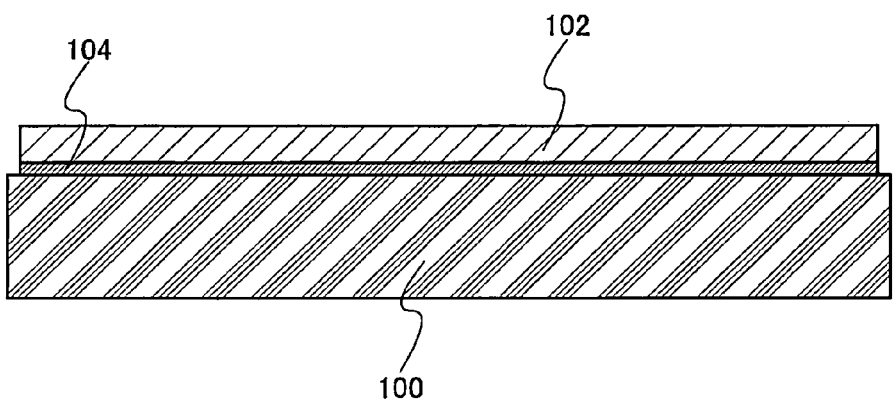
FIG. 1 is a cross-sectional view illustrating a structure of an SOI substrate.

Hereinafter, embodiment modes of the present invention will be described with reference to the accompanying drawings. Note that the present invention is not limited to the following description, and it is easily understood by those skilled in the art that modes and details thereof can be modified in various ways without departing from the spirit and the scope of the present invention. Therefore, the present invention should not be interpreted as being limited to the following description of the embodiment modes. In a structure of the present invention to be given below, the same portions or portions having similar functions may be denoted by the same reference numerals in different drawings.

(Embodiment Mode 1)

This embodiment mode will describe a structure and a manufacturing method of an SOI substrate with reference to the drawings.

An SOI substrate in this embodiment mode includes a bonding layer 104 formed over a supporting substrate 100 and an SOI layer 102 formed over the bonding layer 104 as illustrated in FIG. 1.

The bonding layer 104 which forms a smooth and activated surface is formed over the surface of the SOI layer 102, and the supporting substrate 100 and the bonding layer 104 are bonded to each other, whereby the SOI substrate which includes the bonding layer 104 formed over the supporting substrate 100 and the SOI layer 102 formed over the bonding layer 104 can be manufactured. Note that the SOI substrate illustrated in FIG. 1 may also be manufactured by forming the bonding layer 104 which forms a smooth and activated surface over the surface of the supporting substrate 100 and bonding the bonding layer 104 and the SOI layer 102 to each other.

In FIG. 1, as the supporting substrate 100, an insulating substrate such as a variety of glass substrates used in the electronics industries, e.g. an aluminosilicate glass substrate, an aluminoborosilicate glass substrate, and a barium borosilicate glass substrate, can be used. Note that an insulating layer such as a film of silicon nitride containing oxygen (SiNO) or a film of silicon oxide containing nitrogen (SiON) may also be formed over the insulating substrate.

The SOI layer 102 is a single-crystalline semiconductor, and single-crystalline silicon is typically used. In addition, silicon which can be separated from a single-crystalline semiconductor substrate or a polycrystalline semiconductor substrate by irradiation with hydrogen or a rare gas using an ion doping method or an ion implantation method, or germanium which can be separated from a single-crystalline semiconductor substrate or a polycrystalline semiconductor substrate by irradiation with hydrogen or a rare gas using an ion doping method or an ion implantation method can be used. Further, a crystalline semiconductor layer which is formed of a compound semiconductor such as silicon germanium, gallium arsenide, or indium phosphide can be used.

For the bonding layer 104, a silicon oxide layer formed by a chemical vapor deposition (CVD) method can be used. Examples of a CVD method include a plasma CVD method, a thermal CVD method, and a photo CVD method, and the method may be selected as appropriate depending on a source gas. For example, as the bonding layer 104, a silicon oxide film formed by a thermal CVD method using a mixed gas of $SiH_4$ and $NO_2$, or a silicon oxide film formed by a plasma CVD method using a mixed gas of a TEOS gas and an oxygen gas can be used. By providing any of the above silicon oxide films at a bonding interface between a single-crystalline semiconductor substrate and a supporting substrate, adherence between the substrates can be improved. In addition, a flat silicon oxide film which can be bonded to the substrate with a high level of adherence at low temperatures of 350° C. or less can be formed by a thermal CVD method using a mixed gas of $SiH_4$ and $NO_2$, or by a CVD method or a plasma CVD method using a TEOS gas and an oxygen gas.

Examples of a silane based gas that can be used include silicon-containing compounds such as ethyl silicate, tetramethylsilane, tetramethylcyclotetrasiloxane, octamethylcyclotetrasiloxane, hexamethyldisilazane, triethoxysilane, trisdimethylaminosilane, and tetraethyl orthosilicate (TEOS).

In addition, the bonding layer 104 can be formed using a thermal oxide layer formed by heating a single-crystalline semiconductor substrate at high temperature, or a chemical oxide. A chemical oxide can be formed by, for example, treatment of the surface of the single-crystalline semiconductor substrate with ozone-containing water. A chemical oxide is formed so as to reflect the flatness of the surface of the single-crystalline semiconductor substrate, which is preferable. A stacked-layer including a thermal oxide layer and a chemical oxide may also be used. In addition, termination treatment with H or F may be performed to the surface of the bonding layer 104.

The bonding layer 104 having a smooth and activated surface is provided to have a thickness of 1 nm to 600 nm, preferably 5 nm to 500 nm, more preferably 5 nm to 200 nm. With such a thickness, it is possible to smooth roughness of the surface on which a bond is to be formed and to ensure smoothness of the surface of the bonding layer 104. In addition, it is possible to ease distortion of the single-crystalline semiconductor substrate and the supporting substrate that are bonded. In bonding the SOI layer 102 to the supporting substrate 100 that is a flexible substrate having an insulating surface, the supporting substrate 100 and the SOI layer 102 can be strongly bonded to each other by provision of the bonding layer 104 made of a silicon oxide layer, preferably a thermal oxide layer, a silicon oxide layer formed by treating the surface of the single-crystalline semiconductor substrate with ozone water, or a silicon oxide layer formed using silane as a material, for one or both of bonding surfaces of the supporting substrate 100 and the SOI layer 102.

A silicon oxynitride film, a silicon nitride oxide film, or the like may be formed between the SOI layer 102 and the bonding layer 104. Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 25 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %. Note that aluminum nitride, aluminum nitride oxide, or the like may also be used.

The structure of the SOI substrate is not limited to the one illustrated in FIG. 1. As illustrated in FIGS. 2A to 3B, a structure in which at least a barrier layer 105 and the bonding layer 104 are provided between the supporting substrate 100 and the SOI layer 102 may be employed. With this structure, when the SOI layer 102 is bonded to the supporting substrate 100, the SOI layer 102 can be prevented from being contaminated due to impurities such as movable ions of an alkali metal, an alkaline earth metal, or the like that are diffused from a flexible insulating substrate, a flexible metal substrate, or a flexible substrate having an insulating surface that is used for the supporting substrate 100. As the barrier layer 105, a nitrogen-containing insulating layer is preferably used. Typically, the barrier layer 105 is formed by stacking one or more of a silicon nitride layer, a silicon nitride oxide layer, a silicon oxynitride layer, an aluminum nitride layer, an aluminum nitride oxide layer, and an aluminum oxynitride layer. Note that if the barrier layer 105 is provided, the top layer (the surface not on the supporting substrate side) is preferably a silicon oxide film formed by a plasma CVD method using a mixed gas of a TEOS gas and an oxygen gas, or a silicon oxide film formed by a thermal CVD method using a mixed gas of a silane based gas and an oxygen gas. As the barrier layer 105, for example, a stacked-layer can be used in which a silicon oxide layer formed by a CVD method or a plasma CVD method using a mixed gas of a TEOS gas and an oxygen gas, a silicon oxynitride layer, and a silicon nitride oxide layer are stacked in order from the SOI layer 102 side.

Figure 2A:
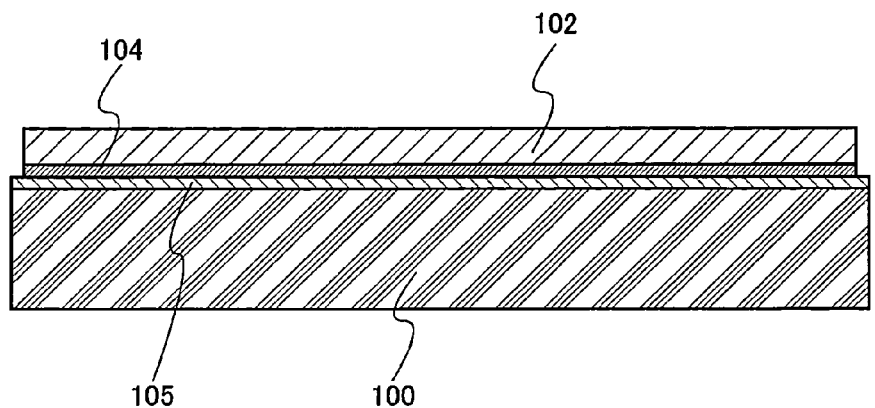
FIGS. 2A and 2B are cross-sectional views each illustrating a structure of an SOI substrate.

FIG. 2A illustrates a structure in which the barrier layer 105 is provided between the bonding layer 104 and the supporting substrate 100. Here, the barrier layer 105 is formed over the supporting substrate 100, the bonding layer 104 is formed over the surface of the SOI layer 102, and the barrier layer 105 and the bonding layer 104 are bonded to each other. Alternatively, a structure can be employed in which the bonding layer 104 is formed over the supporting substrate 100, the barrier layer 105 is formed over the surface of the SOI layer 102, and the barrier layer 105 and the bonding layer 104 are bonded to each other. Furthermore, a structure can also be employed in which the barrier layer 105 and the bonding layer 104 are stacked in order over one of bonding surfaces of the supporting substrate 100 and the SOI layer 102, and the bonding layer 104 is bonded to the other of the bonding surfaces of the supporting substrate 100 and the SOI layer 102.

Figure 2B:
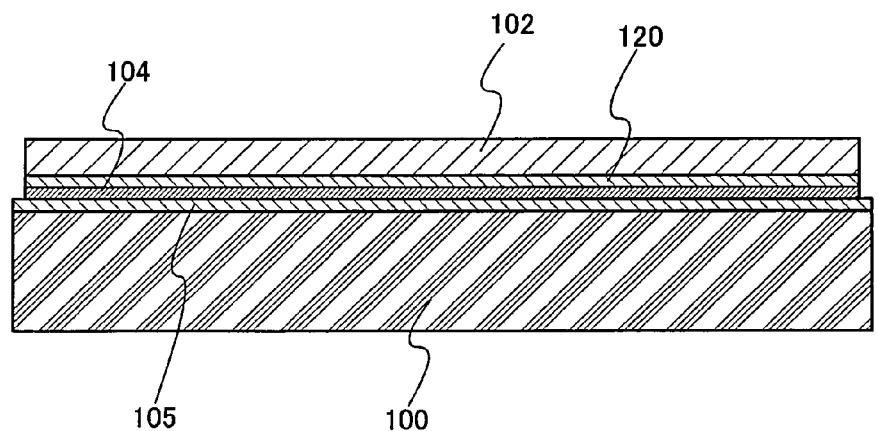

FIG. 2B illustrates a structure in which the bonding layer 104 and a plurality of barrier layers 105 and 120 is provided between the supporting substrate 100 and the SOI layer 102. Here, the barrier layer 105 is formed over the supporting substrate 100, the barrier layer 120 and the bonding layer 104 are stacked in order over the surface of the SOI layer 102, and the barrier layer 105 and the bonding layer 104 are bonded to each other. Alternatively, a structure can also be employed in which the barrier layer 105 and the bonding layer 104 are stacked in order over the supporting substrate 100, the barrier layer 120 is provided over the surface of the SOI layer 102, and the barrier layer 120 and the bonding layer 104 are bonded to each other.

Figure 3A:
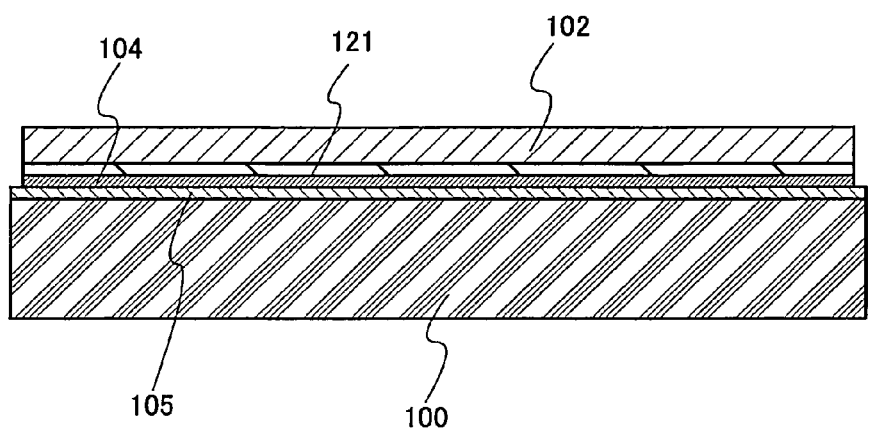
FIGS. 3A and 3B are cross-sectional views each illustrating a structure of an SOI substrate.
Figure 3B:
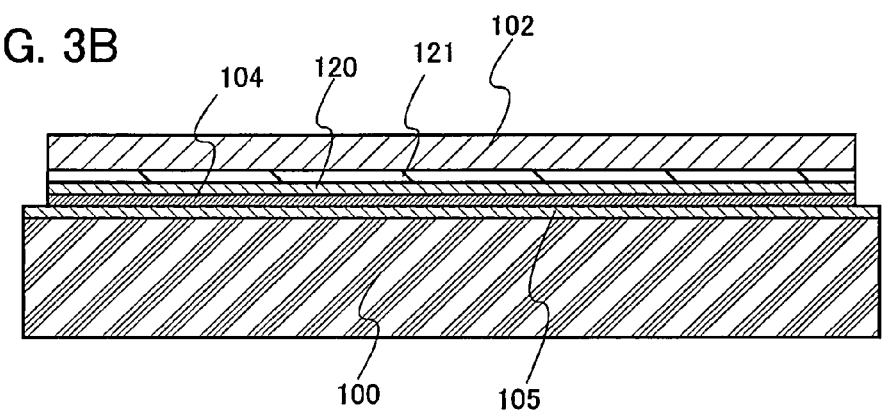

FIGS. 3A and 3B illustrate a structure in which an insulating layer 121 is provided at least between the supporting substrate 100 and the SOI layer 102, in addition to the barrier layer 105 and the bonding layer 104. The insulating layer 121 can be provided between the SOI layer 102 and the bonding layer 104, between the bonding layer 104 and the barrier layer 105, or between the supporting substrate 100 and the barrier layer 105.

FIG. 3A illustrates a structure in which the bonding layer 104, the barrier layer 105, and the insulating layer 121 are provided between the supporting substrate 100 and the SOI layer 102. Here, the barrier layer 105 is provided over the supporting substrate 100, the insulating layer 121 and the bonding layer 104 are stacked in order over the surface of the SOI layer 102, and the barrier layer 105 and the bonding layer 104 are bonded to each other. Alternatively, a structure can also be employed in which the barrier layer 105 and the bonding layer 104 are stacked in order over the supporting substrate 100, the insulating layer 121 is provided over the surface of the SOI layer 102, and the bonding layer 104 and the insulating layer 121 are bonded to each other.

FIG. 3B illustrates a structure which includes, in addition to the barrier layer 105 over the surface of the supporting substrate 100 as in FIG. 3A, the barrier layer 120 provided for the surface of the SOI layer 102. Here, the barrier layer 105 is formed over the supporting substrate 100, the insulating layer 121, the barrier layer 120, and the bonding layer 104 are stacked in order over the surface of the SOI layer 102, and the barrier layer 105 and the bonding layer 104 are bonded to each other. Alternatively, a structure can also be employed in which the barrier layer 105 and the bonding layer 104 are stacked in order over the supporting substrate 100, the insulating layer 121 and the barrier layer 120 are stacked in order over the surface of the SOI layer 102, and the bonding layer 104 and the barrier layer 120 are bonded to each other.

The insulating layer 121 is preferably a thermal oxide layer formed by subjecting the single-crystalline semiconductor substrate to high-temperature heat treatment. Further, a layer formed by a chemical vapor deposition method using TEOS as in the case of the bonding layer 104 may be used. As the insulating layer 121, a chemical oxide can also be used. A chemical oxide can be formed by, for example, treatment of the surface of a single-crystalline semiconductor substrate with ozone-containing water. A chemical oxide reflects the flatness of the surface of the single-crystalline semiconductor substrate, which is preferable.

Next, an example of a manufacturing method of the SOI substrate of this embodiment mode will be described. Here, a manufacturing method of the SOI substrate illustrated in FIG. 1 will be described.

Figure 4A:
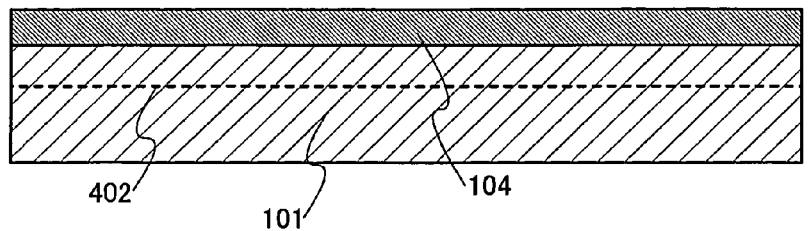
FIGS. 4A to 4C are cross-sectional views illustrating a manufacturing method of an SOI substrate.

First, a single-crystalline silicon substrate 101 with a thickness of 50 μm or less in which a brittle layer 402 is formed by irradiation with hydrogen or a rare gas using an ion doping method or an ion implantation method is prepared (FIG. 4A). In this embodiment mode, after the brittle layer 402 is formed in the single-crystalline silicon substrate 101, the single-crystalline silicon substrate is thinned to a thickness of 50 μm or less by a polishing step such as chemical mechanical polishing (CMP). Here, an ion implantation method means a method in which ions are separated by mass, and an ion doping method means a method in which ions are not separated by mass. The irradiation with hydrogen or a rare gas is performed using an ion doping method or an ion implantation method in consideration of the thickness of a single-crystalline semiconductor layer which is transferred to the supporting substrate. The thickness of the single-crystalline semiconductor layer is 10 nm to 200 nm, preferably 10 nm to 50 nm. The accelerating voltage in irradiation with hydrogen or a rare gas using an ion doping method or an ion implantation method is determined in consideration of such a thickness, so that ions of hydrogen or a rare gas are added or implanted at a deep part of the single-crystalline silicon substrate 101. By this treatment, the brittle layer 402 is formed in a region at a certain depth from the surface of the single-crystalline silicon substrate 101. In an ion doping method in formation of the brittle layer, not only $H^+$ ions but also either $H_3^+$ ions or $H_2^+$ ions may be used as a main ion. Further, in an ion implantation method, not only $H^+$ ions but also $H_3^+$ ions or $H_2^+$ ions which are cluster ions of hydrogen may be implanted. The brittle layer 402 may be formed using not only hydrogen ions but also rare gas ions, or a mixture of hydrogen ions and rare gas ions. Before the brittle layer 402 is formed, a natural oxide film, a chemical oxide, or an oxide film formed by irradiation with UV light in an atmosphere containing oxygen is preferably formed over the surface of the single-crystalline silicon substrate. A chemical oxide can be formed by treatment of the surface of the single-crystalline silicon substrate with oxidizer such as ozone water, a solution of hydrogen peroxide, or sulfuric acid. Further, before the brittle layer 402 is formed, a thermal oxide film, an oxide film formed by a CVD method using a silane based gas, a silicon oxynitride film, a silicon nitride oxide film, or the like may be formed. By forming the oxide film over the surface of the single-crystalline silicon substrate, roughness of the surface due to etching of the surface of the single-crystalline silicon substrate in formation of the brittle layer can be prevented.

Without limitation to the single-crystalline silicon substrate, a single-crystalline silicon germanium substrate or the like may also be used. By thinning the single-crystalline silicon substrate to a thickness of 50 μm or less, the single-crystalline silicon substrate can be flexible. By bonding the single-crystalline silicon substrate with a thickness of 50 μm or less and the supporting substrate such as a glass substrate to each other, the shape of the surface of the single-crystalline silicon substrate can be fitted to the warped surface of the supporting substrate, so that the substrates can be more strongly bonded to each other at the bonding interface.

Next, a silicon oxide layer is formed as the bonding layer 104 over the single-crystalline silicon substrate 101 (FIG. 4A). The film thickness may be selected as appropriate by a practitioner and may be set to be from 10 nm to 500 nm (preferably, from 20 nm to 50 nm). The bonding layer 104 functions as part of an insulating layer of the SOI substrate later.

Next, the bonding layer 104 formed over the single-crystalline silicon substrate 101 is irradiated with an argon ion beam in vacuum, and atoms on the surface of the bonding layer 104 are placed in an active state in which chemical bonding easily occurs. Here, the bonding layer 104 can be placed in an active state by argon ions, generated by plasma discharge in an argon gas atmosphere, being made to collide with the surface of the bonding layer 104. Note that the surface of the bonding layer 104 is not limited to being placed in an active state by exposure to an argon ion beam, and the bonding layer 104 can be placed in an active state by exposure of the surface of the bonding layer 104 to a plasma atmosphere, X rays, or an electron beam. For a gas used in exposure of the surface of the bonding layer 104 to a plasma atmosphere, oxygen; nitrogen; hydrogen; a rare gas such as argon or helium; a molecular gas such as ammonia; or the like can be used. Note that it is preferable that the energy in irradiation of the substrate be controlled by a DC bias within a range of approximately from several volts to 400 volts. Moreover, the surface of the bonding layer 104 may be placed in an active state by exposure to an ion atmosphere of ions that have energy of 20 eV or more. By activating the surface of the bonding layer 104, the single-crystalline silicon substrate and the supporting substrate can be more easily bonded to each other.

Although the bonding layer 104 is formed over the single-crystalline silicon substrate after the single-crystalline silicon substrate provided with the brittle layer 402 is thinned to a thickness of 50 μm or less, the present invention is not limited thereto. For example, after the bonding layer is formed over the single-crystalline silicon substrate provided with the brittle layer, the single-crystalline silicon substrate may be thinned to a thickness of 50 μm or less. Alternatively, after the bonding layer is formed over the single-crystalline silicon substrate, the brittle layer may be formed, and the single-crystalline silicon substrate may be thinned to a thickness of 50 μm or less.

Next, the single-crystalline silicon substrate 101 and the supporting substrate 100 which is prepared separately are bonded to each other. In this embodiment mode, a glass substrate is used as the supporting substrate 100. The surface of the glass substrate is preferably cleaned in advance.

In this embodiment mode, a bond is formed by disposing the bonding layer 104 on the side of the single-crystalline silicon substrate 101 and the supporting substrate 100 in close contact with each other. The bond can be formed at room temperature. This bonding is carried out at the atomic level, and a strong bond is formed at room temperature by van der Waals' forces and hydrogen bond. Further, by performing heat treatment at 400° C. to 700° C., covalent bond is formed so that the bond gets stronger.

Figure 4B:
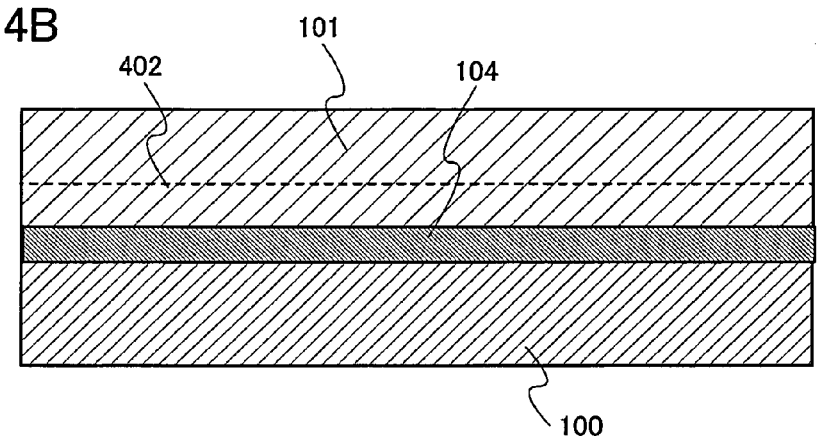
Figure 4C:
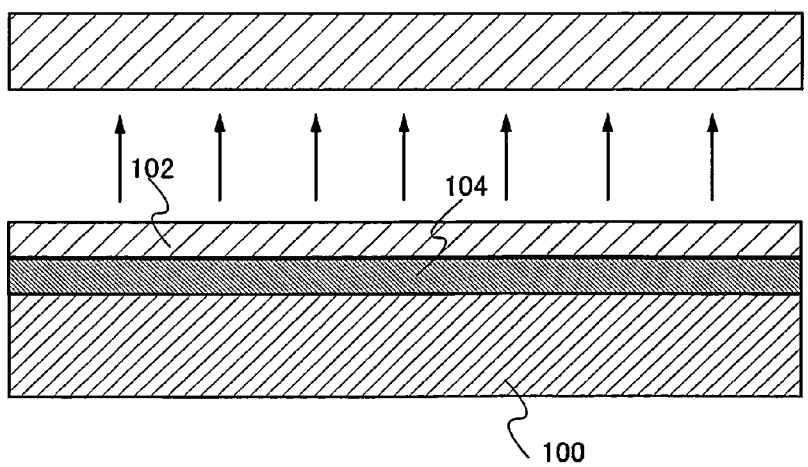

Next, after the single-crystalline silicon substrate 101 and the supporting substrate 100 are bonded to each other, heat treatment is performed, so that a single-crystalline silicon layer (also referred to as an SOI layer) 102, which is part of the single-crystalline silicon substrate 101, is separated from the single-crystalline silicon substrate 101 (FIG. 4C). Through this heat treatment, the volumes of fine voids which are formed in the brittle layer 402 are changed, and a ruptured section is generated along the brittle layer 402. Therefore, the single-crystalline silicon layer 102 can be separated along the ruptured section. After that, heat treatment is preferably performed at 400° C. to 700° C. so that the bond can be still stronger. Accordingly, an SOI substrate in which the thin single-crystalline silicon layer 102 is formed over the supporting substrate 100 can be manufactured (FIG. 4C).

In this embodiment mode, a reinforcement substrate may be used so that treatment such as ion doping, formation of the insulating film, surface polishing, and cleaning can be more favorably performed to the single-crystalline silicon substrate 101 which is thinned to a thickness of 50 μm or less. That is, the single-crystalline silicon substrate 101 is temporarily fixed to the reinforcement substrate such as an insulating substrate, e.g. a variety of glass substrates used in the electronics industries, or a plastic substrate, using a fixing member such as tape, wax, or an adhesive and bonded to the supporting substrate 100. After that, the fixing member is weakened by heat treatment or irradiation with UV light, so that the single-crystalline silicon substrate 101 is separated from the reinforcement substrate. Alternatively, the single-crystalline silicon substrate 101 is separated from the reinforcement substrate in heat treatment in which the single-crystalline silicon layer 102 is separated from part of the single-crystalline silicon substrate 101.

Preferably, the surface of the supporting substrate 100 or the bonding layer 104 may be subjected to flattening treatment. For example, the surface of the supporting substrate 100 or the bonding layer 104 can be flattened by a polishing step called chemical mechanical polishing (CMP). By flattening the supporting substrate 100 or the bonding layer 104, adherence of the bonded substrates can be increased.

Next, treatment for thinning the single-crystalline silicon layer 102 or flattening the surface thereof is performed. This thinning or flattening treatment can be performed by a polishing step called chemical mechanical polishing (CMP). In this embodiment mode, the final thickness of the single-crystalline silicon layer 102 may be 10 nm to 200 nm (preferably 10 nm to 50 nm, more preferably 10 nm to 30 nm). Note that the polishing step is not necessarily performed and may be performed as needed.

By the above steps, the SOI substrate illustrated in FIG. 1 can be manufactured (FIG. 4C). In this embodiment mode, because a bonding force used to bond substrates is applied to the surfaces of the substrates and the two substrates are superposed on each other, strong bonding can be performed without any high-temperature heat treatment being performed. Consequently, there is no need to use an expensive substrate with high resistance to heat, and an inexpensive glass substrate, plastic substrate or the like can be used; thus, a reduction in manufacturing cost can be achieved. In addition, a flexible substrate that cannot withstand high-temperature processes can also be used, and the range of application of SOI substrates can be increased.

Next, a manufacturing method of an SOI substrate which is different from that illustrated in FIGS. 4A to 4C will be described with reference to FIGS. 5A to 5D. In FIGS. 5A to 5D, a brittle layer is formed in a single-crystalline silicon substrate, the single-crystalline silicon substrate and a supporting substrate are bonded to each other, and then the single-crystalline silicon substrate is separated, whereby a thin SOI substrate is manufactured.

Figure 5A:
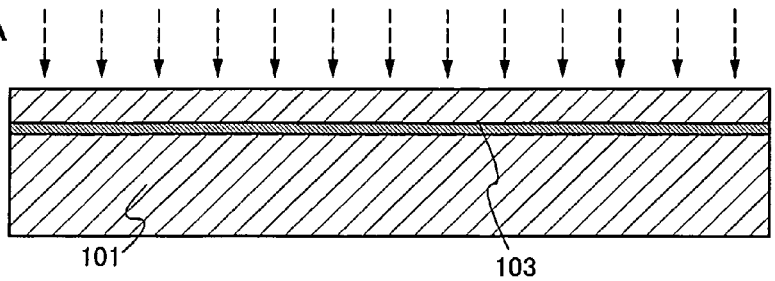
FIGS. 5A to 5D are cross-sectional views illustrating a manufacturing method of an SOI substrate.

First, as illustrated in FIG. 5A, ions that are accelerated by an electric field are added or implanted at a predetermined depth from the surface of a single-crystalline silicon substrate 101 with a thickness of 50 μm or less provided with a silicon oxide film, a silicon oxynitride film, or a silicon nitride oxide film, to form a brittle layer 103. The ion doping or ion implantation is carried out in consideration of the thickness of an SOI layer that is to be transferred to a supporting substrate. The thickness of the SOI layer is set to be 5 nm to 500 nm, preferably 10 nm to 200 nm, more preferably 10 nm to 100 nm, and still more preferably 10 nm to 50 nm. An accelerating voltage for performing ion doping or ion implantation to the single-crystalline silicon substrate 101 is set in consideration of such a thickness. Since the surface of the SOI layer is flattened by polishing or melting after separation, the thickness of the SOI layer right after separation is preferably set to be 50 nm to 500 nm.

The brittle layer 103 is formed by ion doping or ion implantation using ions of hydrogen, helium, or halogen typified by fluorine. In this case, it is preferable to add or implant a plurality of ions of a single atom which has different masses or a plurality of ions of a plurality of atoms which has different masses. In the case of irradiation with hydrogen using an ion doping method or an ion implantation method, the hydrogen ions preferably include $H^+$, $H_2^+$, and $H_3^+$ ions with a high proportion of $H_3^+$ ions. With a high proportion of $H_3^+$ ions, the implantation efficiency can be increased and implantation time can be shortened. By this structure, separation at the brittle layer 103 can be easily performed later.

Figure 5B:
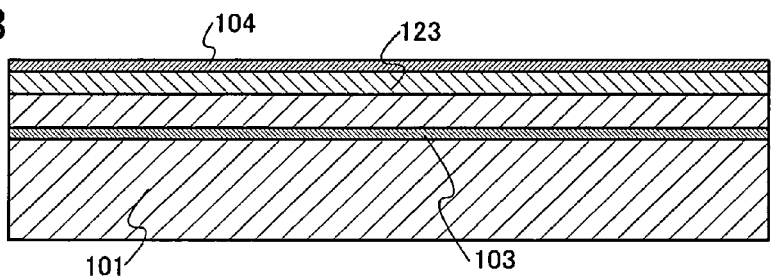

Next, as illustrated in FIG. 5B, at least a cap layer 123 and a bonding layer 104 are formed over the single-crystalline silicon substrate 101. Here, the cap layer 123 is formed over the surface of the single-crystalline silicon substrate 101 and the bonding layer 104 is formed over the cap layer 123. Note that the cap layer 123 is not necessarily provided at this time.

Here, the thickness of at least one of the bonding layer 104 and the cap layer 123 is preferably large. Although a change in the volume of the fine voids formed in the brittle layer 103 occurs by heat treatment in a later process, since the cap layer 123 is provided over the surface of the single-crystalline silicon substrate, the surface of the single-crystalline silicon substrate can be kept flat. As a result, when distortion occurs in the brittle layer 103 due to the change in the volume of fine voids formed in the brittle layer 103, it is possible to weaken part of the single-crystalline silicon substrate along the brittle layer 103. In particular, when the thickness of the cap layer 123 is made to be large, a pressure is applied perpendicularly to the surface of the single-crystalline silicon substrate 101 in heat treatment, so that the brittle layer is more weakened while keeping the surface of the single-crystalline silicon substrate flat.

The cap layer 123 can be formed using a single layer or a stacked-layer of a nitrogen-containing insulating layer and/or a silicon oxide layer. When a part or a whole of the cap layer 123 is formed using the nitrogen-containing insulating layer, the cap layer 123 also functions as a barrier layer, which is preferable.

Next, heating is performed so that the brittle layer 103 is weakened. As a result, part of the single-crystalline silicon substrate 101 can be easily separated from the supporting substrate 100 using the brittle layer as a cleavage plane in a later process. The temperature of heat treatment is preferably less than a temperature at which separation occurs at the brittle layer 103 and a temperature at which the brittle layer 103 is weakened. For example, heat treatment is performed at temperatures of less than 400° C., preferably less than 350° C., more preferably less than 300° C. By such a method, a separation step can be performed at low temperature. Therefore, as the supporting substrate 100, a plastic substrate made of PET (polyethylene terephthalate), PEN (polyethylenenaphthalate), PES (polyethersulfone), polypropylene, polypropylene sulfide, polycarbonate, polyetherimide, polyphenylene sulfide, polyphenylene oxide, polysulfone, polyphthalamide, or the like; or a flexible insulating substrate made of a fibrous material such as paper may be used.

By using a prepreg for the flexible insulating substrate, damage caused by a point pressure or a linear pressure to the SOI substrate and a semiconductor device to be manufactured later can be prevented. A typical example of the prepreg can be obtained as follows: a fiber body such as polyvinyl alcoholic fiber, polyester fiber, polyamide fiber, polyethylene fiber, aramid fiber, poly(p-phenylenebenzobisoxazole) fiber, glass fiber, or carbon fiber is impregnated with a varnish which is obtained by diluting a matrix resin such as an epoxy resin, an unsaturated polyester resin, a polyimide resin, or a fluorine resin with an organic solvent, and then the matrix resin is half-cured by volatilizing the organic solvent by drying.

In addition, a metal film provided with an insulating layer such as a silicon oxide layer, a silicon nitride layer, a silicon oxynitride layer, an aluminum nitride layer, or an aluminum oxide layer, or a flexible metal substrate in which an insulating layer is formed over the surface of a metal sheet or the like may be used. Note that the insulating layer is not limited to the above insulating layers.

Although the bonding layer 104 and the cap layer 123 are formed over the single-crystalline silicon substrate after the single-crystalline silicon substrate in which the brittle layer is formed is thinned to a thickness of 50 μm or less, the present invention is not limited thereto. For example, after the bonding layer and the cap layer are formed over the single-crystalline silicon substrate in which the brittle layer is formed, the single-crystalline silicon substrate may be thinned to a thickness of 50 μm or less. Alternatively, after the bonding layer and the cap layer are formed over the single-crystalline silicon substrate, the brittle layer may be formed, and the single-crystalline silicon substrate may be thinned to a thickness of 50 μm or less.

Figure 5C:
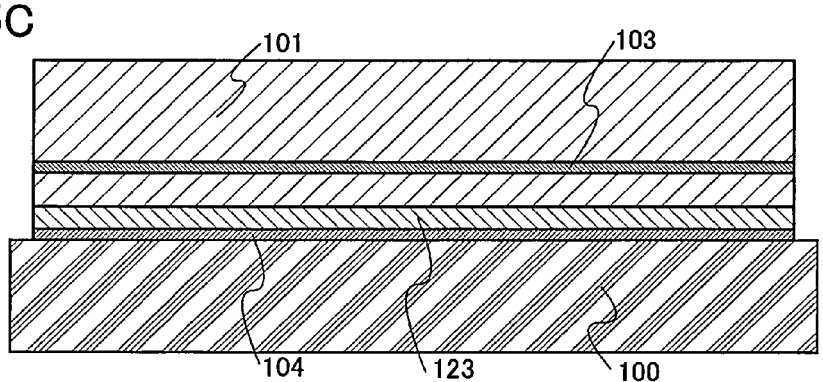

FIG. 5C illustrates a process in which the bonding layer 104 over the single-crystalline silicon substrate 101 provided with the cap layer 123 and the bonding layer 104 and the supporting substrate 100 are disposed in close contact with each other and bonded to each other. The bonding layer 104 over the single-crystalline silicon substrate 101 is bonded to the supporting substrate 100 by being disposed in close contact therewith.

In order to form a favorable bond, the bonding surface may be activated. For example, the bonding surface is irradiated with an atomic beam or an ion beam. When an atomic beam or an ion beam is used, an inert gas neutral atomic beam or inert gas ion beam of argon or the like can be used. Alternatively, plasma irradiation or radical treatment may be performed. Further, at least one of the bonding surfaces of the flexible substrate having an insulating surface and the single-crystalline semiconductor substrate may be subjected to treatment by oxygen plasma or washing with ozone water to be hydrophilic. Such a surface treatment makes it possible to easily perform bonding between different kinds of materials even if heat treatment is performed at temperature of less than 400° C. By irradiation of the surface of the substrate with an argon ion beam or the like, an adsorbed gas, a natural oxide film, or the like present on the surface of the substrate is etched. A bonding force used to bond the substrates to each other is applied to the surface of the substrate, and then, the two substrates can be bonded to each other by being superposed on each other. At the interface of the bonded substrates, interatomic bonds are formed, and a strong bond can be formed without any heat treatment being performed.

Figure 5D:
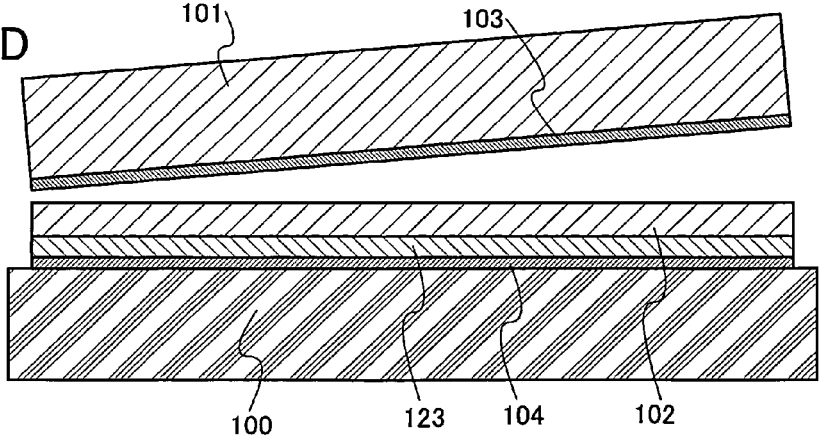

After that, by separation of part of the single-crystalline silicon substrate 101 as illustrated in FIG. 5D, the SOI substrate can be obtained. Note that the surface of the SOI layer 102 obtained by separation is preferably flattened. Further, CMP or the like may be performed so that the SOI layer obtained is thinned. Before part of the single-crystalline silicon substrate 101 is separated from the supporting substrate 100 using the brittle layer 103 as a cleavage plane, treatment may be performed such that separation can be easily conducted. When part of the single-crystalline silicon substrate 101 is separated from the supporting substrate 100, an adhesive sheet which can be separated by light or heat is provided for at least one of the surfaces of the supporting substrate 100 and the single-crystalline silicon substrate 101 to fix one of the supporting substrate 100 and the single-crystalline silicon substrate 101, and the other is separated, so that separation can be more easily performed. At this time, by provision of a supporting member for the supporting substrate 100 or the single-crystalline silicon substrate 101 which is separated, a separation process can be easily carried out. By such a method, a separation step can be performed at low temperature. Therefore, as the supporting substrate 100, a plastic substrate made of PET (polyethylene terephthalate), PEN (polyethylenenaphthalate), PES (polyethersulfone), polypropylene, polypropylene sulfide, polycarbonate, polyetherimide, polyphenylene sulfide, polyphenylene oxide, polysulfone, polyphthalamide, or the like; or a flexible insulating substrate made of a fibrous material such as paper may be used.

By using a prepreg for the flexible insulating substrate, damage caused by a point pressure or a linear pressure to the SOI substrate and a semiconductor device to be manufactured later can be prevented. A typical example of the prepreg can be obtained as follows: a fiber body such as polyvinyl alcoholic fiber, polyester fiber, polyamide fiber, polyethylene fiber, aramid fiber, poly(p-phenylenebenzobisoxazole) fiber, glass fiber, or carbon fiber is impregnated with a varnish which is obtained by diluting a matrix resin such as an epoxy resin, an unsaturated polyester resin, a polyimide resin, or a fluorine resin with an organic solvent, and then the matrix resin is half-cured by volatilizing the organic solvent by drying.

In addition, a metal film provided with an insulating layer such as a silicon oxide layer, a silicon nitride layer, a silicon oxynitride layer, an aluminum nitride layer, or an aluminum oxide layer, or a flexible metal substrate in which an insulating layer is formed over the surface of a metal sheet or the like may be used. Note that the insulating layer is not limited to the above insulating layers.

Instead of the heat treatment which is performed before the supporting substrate 100 and the single-crystalline silicon substrate 101 are bonded to each other, after the supporting substrate 100 and the single-crystalline silicon substrate 101 are bonded to each other, the single-crystalline silicon substrate 101 may be irradiated with a laser beam from the supporting substrate 100 side to heat the brittle layer 103. As a result, the brittle layer is used as a cleavage plane, so that part of the single-crystalline silicon substrate 101 can be separated from the supporting substrate 100.

Then, a manufacturing process of an SOI substrate in which a supporting substrate and a single-crystalline silicon substrate are bonded to each other with an adhesive layer interposed therebetween will be described with reference to FIGS. 14A to 14C.

Figure 14A:
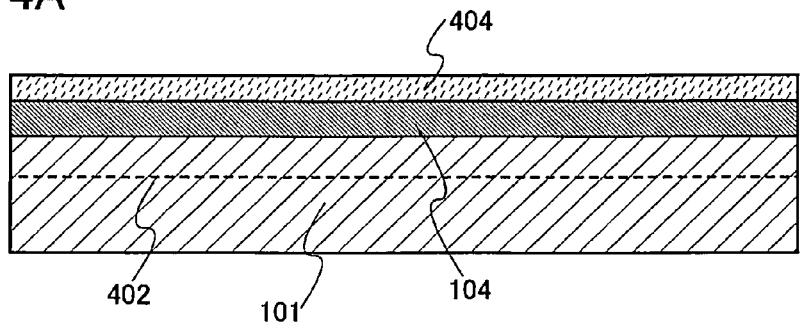
FIGS. 14A to 14C are cross-sectional views illustrating a manufacturing method of an SOI substrate.

First, a single-crystalline silicon substrate 101 is irradiated with hydrogen or a rare gas using an ion doping method or an ion implantation method to form a brittle layer 402, the single-crystalline silicon substrate 101 is thinned to a thickness of 50 μm or less, and a bonding layer 104 is formed over the single-crystalline silicon substrate 101 (FIG. 14A).

Next, an adhesive layer 404 is formed over the bonding layer 104 (FIG. 14A). In this embodiment mode, a liquid or gel bond material can be used for the adhesive layer 404. For example, a coated silicon oxide film formed by spin on glass (SOG), tetraethyl orthosilicate (TEOS), hexamethyldisilazane (HMDS), or the like may be used.

Although the bonding layer 104 and the adhesive layer 404 are formed over the single-crystalline silicon substrate after the single-crystalline silicon substrate in which the brittle layer 402 is formed is thinned to a thickness of 50 μm or less in this embodiment mode, the present invention is not limited thereto. For example, after the bonding layer 104 and the adhesive layer 404 are formed over the single-crystalline silicon substrate in which the brittle layer 402 is formed, the single-crystalline silicon substrate may be thinned to a thickness of 50 μm or less. Alternatively, after the bonding layer and the adhesive layer are formed over the single-crystalline silicon substrate, the brittle layer may be formed, and the single-crystalline silicon substrate may be thinned to a thickness of 50 μm or less.

Figure 14B:
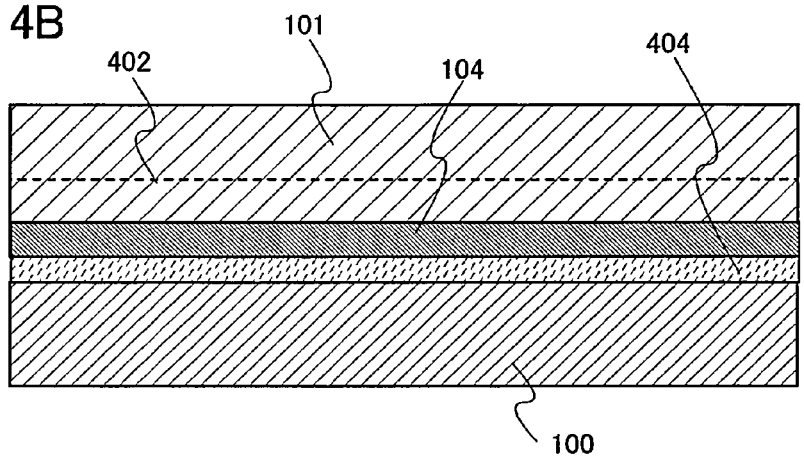

Next, the single-crystalline silicon substrate 101 and a supporting substrate 100 which is prepared separately are bonded to each other with the bonding layer 104 and the adhesive layer 404 interposed therebetween (FIG. 14B). Note that the substrates are preferably disposed in vacuum of 100 Pa or less, preferably 30 Pa or less before and during the bonding. In addition, by heating the substrates in vacuum during the bonding, an organic component in the adhesive layer may be removed.

Figure 14C:
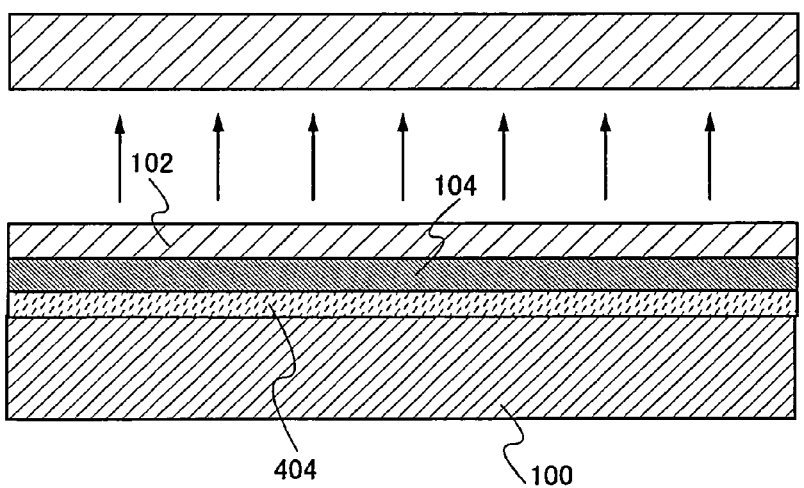

Then, heat treatment is performed, and a single-crystalline silicon layer 102, which is part of the single-crystalline silicon substrate 101, is separated from the single-crystalline silicon substrate 101 (FIG. 14C). After that, preferably, heat treatment is performed at 400° C. to 600° C. so that the bond gets still stronger. Accordingly, an SOI substrate in which the SOI layer 102 is formed over the supporting substrate 100 with the bonding layer 104 and the adhesive layer 404 interposed therebetween can be manufactured (FIG. 14C).

Note that the bonding layer 104 is not necessarily formed, and the single-crystalline silicon substrate and the supporting substrate may be bonded to each other with the adhesive layer 404 interposed therebetween.

In the above method, the single-crystalline silicon substrate and the supporting substrate are bonded to each other with the liquid or gel adhesive layer interposed therebetween. Therefore, even when a space is formed at the bonding interface between the single-crystalline silicon substrate and the supporting substrate, the space can be filled with the liquid or gel adhesive layer, whereby adherence of the substrates can be improved.

(Embodiment Mode 2)

This embodiment mode will describe a semiconductor device using an SOI substrate with reference to the drawings.

Although a semiconductor device is manufactured in this embodiment mode using an SOI substrate in which a single-crystalline silicon substrate and a supporting substrate are bonded to each other with a bonding layer 104 and a barrier layer 105 interposed therebetween as illustrated in FIGS. 2A and 2B, the present invention is not limited thereto.

Figure 6A:
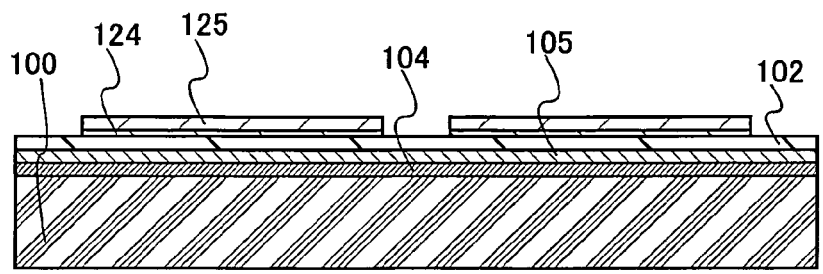
FIGS. 6A to 6E are cross-sectional views illustrating a manufacturing method of a semiconductor device using an SOI substrate.

In FIG. 6A, an SOI layer 102 is provided over a supporting substrate 100 with a bonding layer 104 and a barrier layer 105 interposed therebetween. Over the SOI layer 102, a silicon nitride layer 124 and a silicon oxide layer 125 are formed in a region corresponding to an element formation region. The silicon oxide layer 125 is used as a hard mask when the SOI layer 102 is etched for element isolation. The silicon nitride layer 124 is used as an etching stopper.

The thickness of the SOI layer 102 ranges from 5 nm to 500 nm, preferably 10 nm to 200 nm. To the SOI layer 102, a p-type impurity such as boron, aluminum, or gallium is added in order to control threshold voltage. For example, boron may be added as a p-type impurity at a concentration of $5 \times 10^{16}$ cm$^{-3}$ or more and $1 \times 10^{18}$ cm$^{-3}$ or less.

Figure 6B:
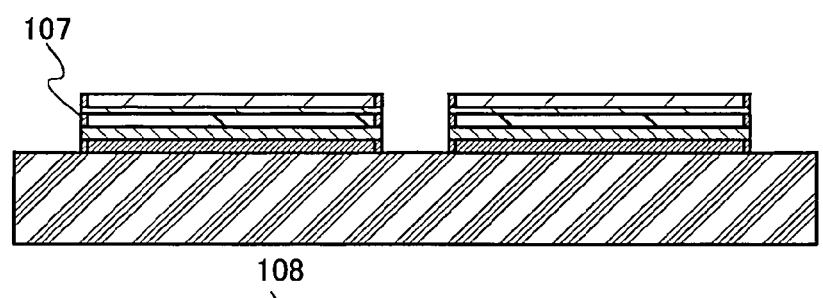

FIG. 6B illustrates a step of etching the SOI layer 102, the barrier layer 105, and the bonding layer 104 using the silicon oxide layer 125 as a mask. Next, exposed end surfaces of the SOI layer 102 and the bonding layer 104 are nitrided by plasma treatment. By this nitridation treatment, a silicon nitride layer 107 is formed in at least a peripheral end portion of the SOI layer 102. The silicon nitride layer 107 has an insulating property and has the effect of preventing leak current from flowing along the end surface of the SOI layer 102. In addition, because of its resistance to oxidation, the silicon nitride layer 107 can prevent an oxide layer from growing from the end surface into a "bird's beak" between the SOI layer 102 and the bonding layer 104.

Figure 6C:
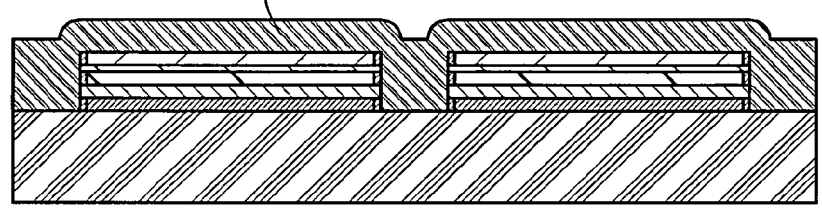

FIG. 6C illustrates a step of deposition of an element isolation insulating layer 108. As the element isolation insulating layer 108, a silicon oxide layer is deposited by a chemical vapor deposition method using TEOS. The element isolation insulating layer 108 is deposited thickly so that the SOI layer 102 is buried.

Figure 6D:
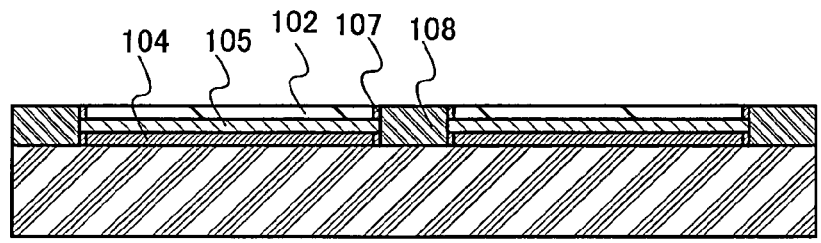

FIG. 6D illustrates a step of partially removing the element isolation insulating layer 108 to expose the silicon nitride layers 124. This removal step may be performed using dry etching or chemical mechanical polishing. The silicon nitride layer 124 functions as an etching stopper. The element isolation insulating layer 108 is left remaining to fill in a gap between the SOI layers 102. The silicon nitride layer 124 is then removed.

Figure 6E:
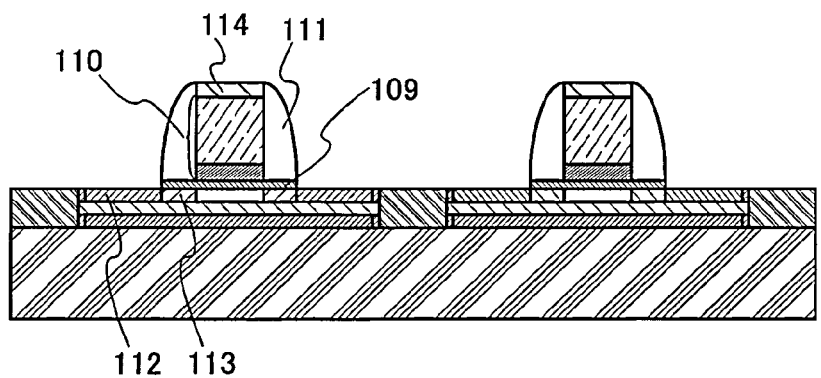

In FIG. 6E, after the SOI layer 102 is exposed, a gate insulating layer 109, a gate electrode 110, and sidewall insulating layers 111 are formed, and first impurity regions 112 and second impurity regions 113 are formed. An insulating layer 114 is formed using a silicon nitride layer and used as a hard mask when the gate electrode 110 is etched.

Figure 7A:
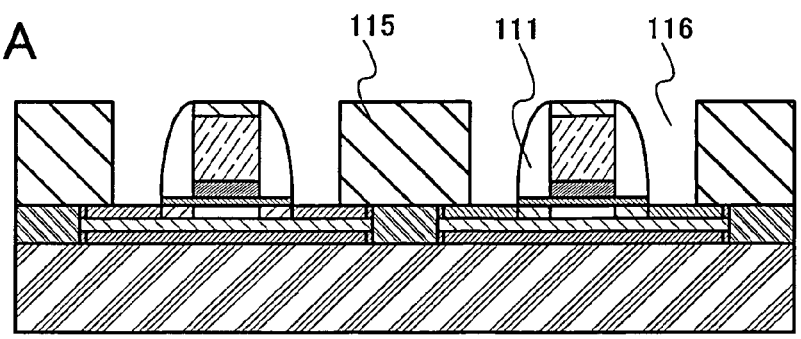
FIGS. 7A and 7B are cross-sectional views illustrating a manufacturing method of a semiconductor device using an SOI substrate.

In FIG. 7A, an interlayer insulating layer 115 is formed. As the interlayer insulating layer 115, a borophosphosilicate glass (BPSG) layer is formed and then flattened by reflow. Alternatively, a silicon oxide layer may be formed using TEOS and then flattened by chemical mechanical polishing treatment. In the flattening treatment, the insulating layer 114 over the gate electrode 110 functions as an etching stopper. A contact hole 116 is formed in the interlayer insulating layer 115. The contact hole 116 is formed into a self-aligned contact structure using the sidewall insulating layer 111.

Figure 7B:
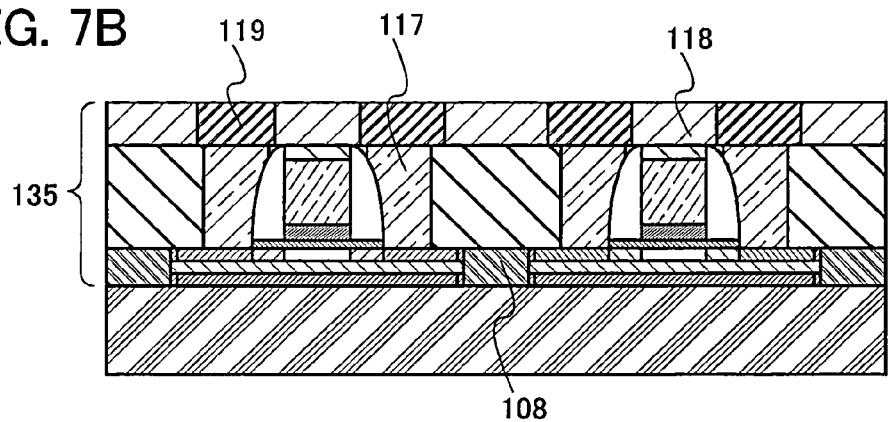

After that, as illustrated in FIG. 7B, a contact plug 117 is formed by a CVD method using tungsten hexafluoride. Furthermore, an insulating layer 118 is formed; an opening is formed to match the contact plug 117; and a wiring 119 is provided therein. The wiring 119 is formed of aluminum or an aluminum alloy and is provided with upper and lower metal layers of molybdenum, chromium, titanium, or the like as barrier metal layers.

Here, a stack which includes from the SOI layers 102 to the insulating layers 118 and the wirings 119 is referred to as an element layer 135.

After that, when a plurality of semiconductor devices is included in the element layer 135, the element layer 135 and the supporting substrate 100 may be divided and the plurality of semiconductor devices may be cut out. By such a process, a plurality of semiconductor devices can be manufactured.

In this manner, a field effect transistor can be manufactured using the SOI layer 102 that is bonded to the supporting substrate 100. Because the SOI layer 102 according to this embodiment mode is a single-crystalline semiconductor with uniform crystal orientations, a uniform and high-performance field effect transistor can be obtained. In other words, it is possible to suppress inhomogeneity of values of important transistor characteristics, such as threshold voltage and mobility, and to achieve high performance such as high mobility. Further, since the barrier layer 105 is provided between the supporting substrate 100 and the SOI layer 102, the SOI layer can be prevented from being contaminated due to impurities from the supporting substrate. Therefore, variation in characteristics of the transistors formed in the element layer can be suppressed.

(Embodiment Mode 3)

This embodiment mode will describe a semiconductor device using an SOI substrate which is manufactured by a method different from that illustrated in FIGS. 6A to 7B, with reference to FIGS. 8A to 9B.

Figure 8A:
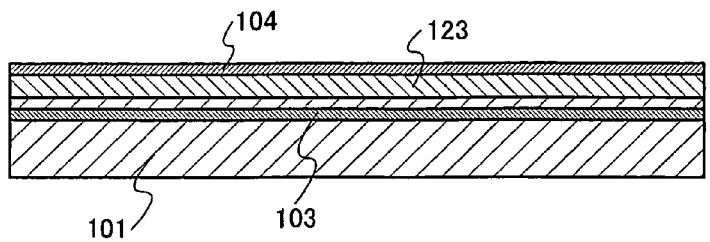
FIGS. 8A to 8D are cross-sectional views illustrating a manufacturing method of a semiconductor device using an SOI substrate.

Similarly to FIG. 5A, as illustrated in FIG. 8A, ions which are accelerated by an electric field are added or implanted at a predetermined depth from the surface of a single-crystalline silicon substrate 101 to form a brittle layer 103. Next, a cap layer 123 and the bonding layer 104 are stacked in order over the surface of the single-crystalline silicon substrate 101.

Figure 8B:
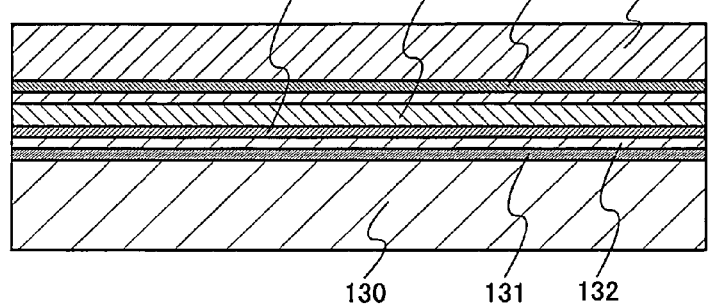

FIG. 8B illustrates a mode in which an insulating layer 132 formed over a supporting substrate 130 and the surface of the bonding layer 104 formed over the single-crystalline silicon substrate 101 are bonded to each other by being disposed in close contact with each other.

A separation layer 131 is formed over the supporting substrate 130, and the insulating layer 132 is formed over the separation layer 131. Next, the insulating layer 132 formed over the supporting substrate 130 and the bonding layer 104 formed over the surface of the single-crystalline silicon substrate 101 are disposed in close contact with each other, and the insulating layer 132 and the bonding layer 104 are bonded to each other. The bond is formed by Van der Waals forces. By pressing the supporting substrate 130 and the single-crystalline silicon substrate 101 against each other, a stronger bond can be formed by hydrogen bond.

In order to form a favorable bond, the bonding surface may be activated. For example, the surface that is to form a bond is irradiated with an atomic beam or an ion beam. When an atomic beam or an ion beam is used, an inert gas neutral atomic beam or inert gas ion beam of argon or the like can be used. Alternatively, plasma irradiation or radical treatment is performed. Such a surface treatment makes it possible to easily perform bonding between the surfaces consisting of different kinds of materials even if temperatures of a heat treatment step are 200° C. and 400° C.

Figure 8C:
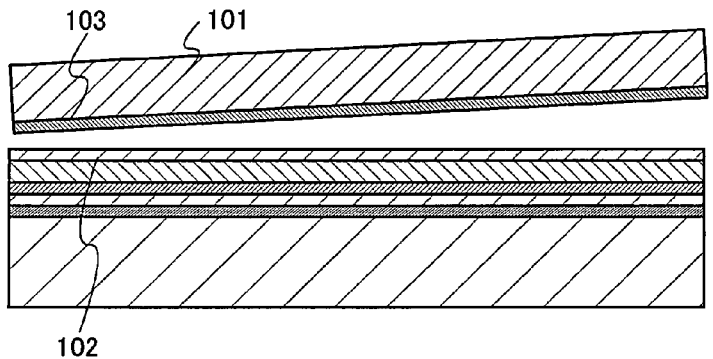

In FIG. 8C, after the single-crystalline silicon substrate 101 and the supporting substrate 130 are bonded to each other, the single-crystalline silicon substrate 101 is subjected to heat treatment at 400° C. to 700° C. A crack is generated in the brittle layer 103, and part of the single-crystalline silicon substrate 101 is separated from the supporting substrate 130 using the brittle layer 103 as a cleavage plane. Since the bonding layer 104 and the supporting substrate 130 are bonded to each other, an SOI layer 102 having the same crystallinity as the single-crystalline silicon substrate 101 is left remaining over the supporting substrate 130.

Note that, instead of the heat treatment, after the supporting substrate 130 and the single-crystalline silicon substrate 101 are bonded to each other, the single-crystalline silicon substrate 101 is irradiated with a laser beam from the supporting substrate 130 side, whereby the brittle layer 103 may be heated. As a result, part of the single-crystalline silicon substrate 101 can be separated from the supporting substrate 130 using the brittle layer as a cleavage plane.

After that, the surface of the SOI layer 102 is preferably flattened. As a flattening method, CMP can be used. Alternatively, the surface of the SOI layer 102 can be irradiated with a laser beam and melted to be flattened.

Figure 8D:
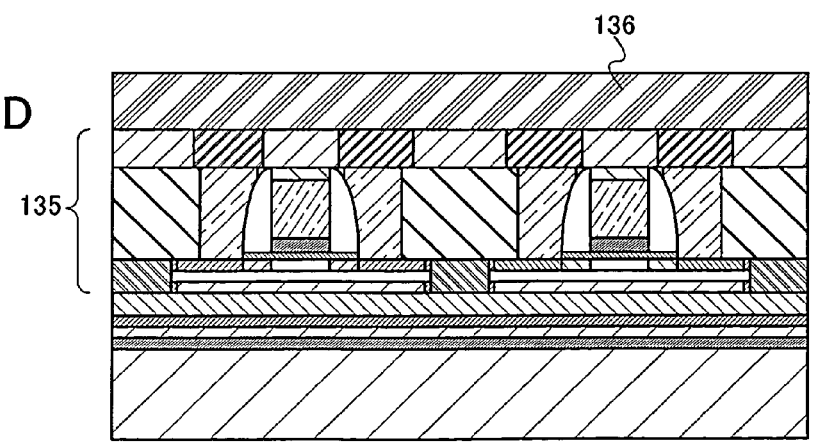

Next, through processes illustrated in FIG. 6A to FIG. 7B, an element layer 135 which includes a transistor using the SOI layer 102 is formed. Next, a flexible substrate 136 is provided over the element layer 135. Thermo compression bonding of the flexible substrate 136 and the element layer 135 is performed, so that the element layer 135 can be attached firmly to the flexible substrate 136. Alternatively, the flexible substrate 136 can be attached firmly to the element layer 135 using an adhesive (not illustrated). As the flexible substrate 136, typical examples given as the supporting substrate 100 can be used as appropriate (FIG. 8D).

After that, a groove may be formed by irradiation of the element layer 135 and the separation layer 131 with a laser beam from the flexible substrate 136 side so that a separation process to be performed later can be easily carried out. As a laser beam used to form a groove, a laser beam having a wavelength absorbed by any of the separation layer 131 and the layers included in the element layer 135 is preferably used. Typically, a laser beam in the UV region, visible region, or infrared region is selected as appropriate for irradiation.

Figure 9A:
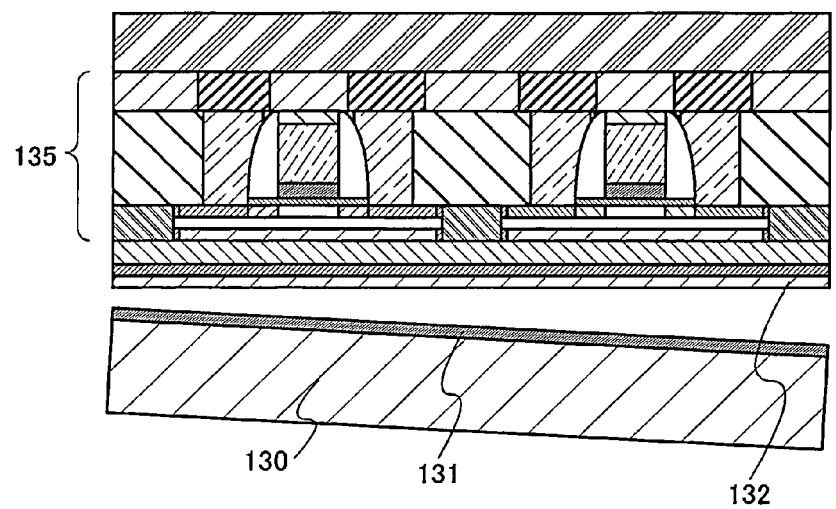
FIGS. 9A and 9B are cross-sectional views illustrating a manufacturing method of a semiconductor device using an SOI substrate.

Next, as illustrated in FIG. 9A, the element layer 135 is separated from the supporting substrate 130 by a physical method. Alternatively, a liquid is made to penetrate the interface between the separation layer 131 and the insulating layer 132, and then the element layer 135 is separated from the supporting substrate 130.

Here, separation occurs at any of the interface between the separation layer 131 and the insulating layer 132, the separation layer 131, and the interface between the supporting substrate 130 and the separation layer 131, so that the element layer 135 can be separated from the supporting substrate 130.

Note that before the element layer 135 and the flexible substrate 136 are separated from the supporting substrate 130 at the separation layer 131, treatment may be performed so that the separation can be easily performed. Further, when the element layer 135 and the flexible substrate 136 are separated from the supporting substrate 130, an adhesive sheet which can be separated by light or heat is provided for at least one of the surfaces of the supporting substrate 130 and the flexible substrate 136 to fix one of the supporting substrate 130 and the flexible substrate 136, and the other is separated, so that separation can be more easily performed. At this time, by provision of a supporting member for the supporting substrate 130 or the flexible substrate 136 which is separated, a separation process can be easily performed.

Figure 9B:
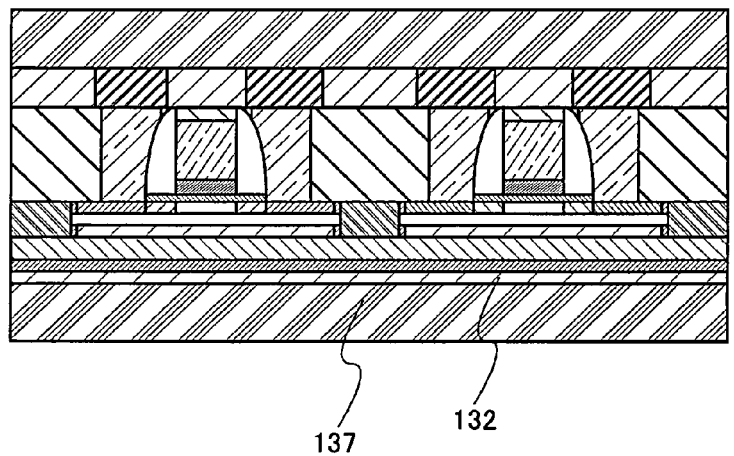

Next, as illustrated in FIG. 9B, a flexible substrate 137 is attached firmly to the insulating layer 132. For the flexible substrate 137, a material and an attaching method which are similar to those of the flexible substrate 136 can be used.

After that, when a plurality of semiconductor devices is included in the element layer 135, the element layer 135, the flexible substrate 136, and the flexible substrate 137 may be divided, and the plurality of semiconductor devices may be cut out. By such a process, a plurality of semiconductor devices can be manufactured.

In this manner, the element layer including a field effect transistor using the SOI layer 102 which is bonded to the supporting substrate 130 is manufactured, and then a semiconductor device which is flexible and thin can be manufactured using the element layer. Since the SOI layer 102 according to this embodiment mode is a single-crystalline semiconductor with uniform crystal orientations, a uniform and high-performance field effect transistor can be obtained. In other words, it is possible to suppress inhomogeneity of values of important transistor characteristics, such as threshold voltage and mobility, and to achieve high performance such as high mobility. Further, since the barrier layer 105 is provided between the supporting substrate 100 and the SOI layer 102, the SOI layer can be prevented from being contaminated by impurities from the supporting substrate. Therefore, variation in characteristics of the transistors formed in the element layer can be suppressed.

Further, the element layer with the field effect transistor is separated from the supporting substrate after formation of the field effect transistor using the SOI layer which is bonded to the supporting substrate, so that a semiconductor device which is flexible and thin is manufactured. Therefore, in a manufacturing process of substrates, the substrates are more easily transferred, and a yield can be improved.

(Embodiment Mode 4)

Figure 10:
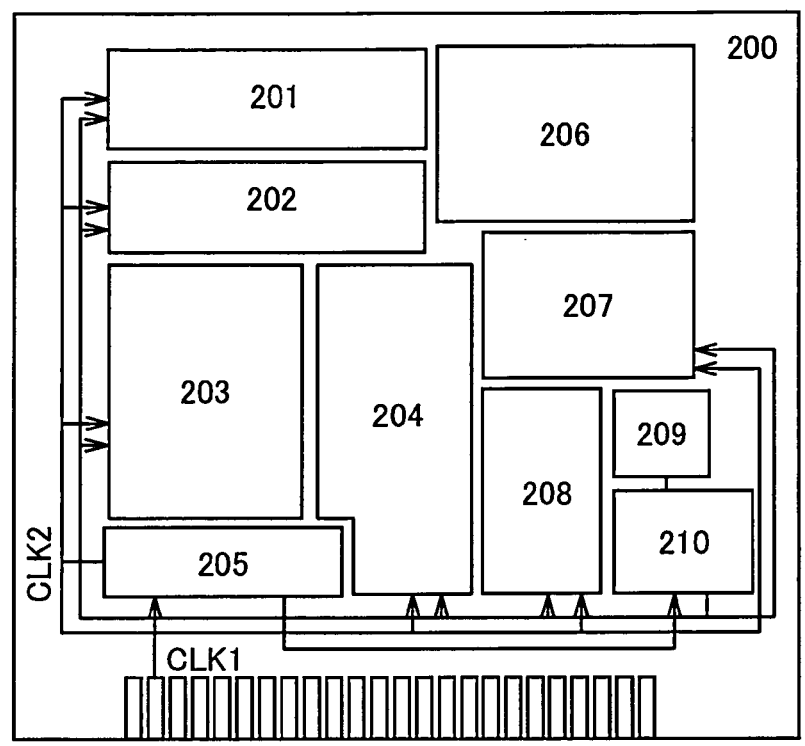
FIG. 10 is a block diagram illustrating a configuration of a microprocessor which is obtained using an SOI substrate.

This embodiment mode will describe an example of a semiconductor device which is manufactured using the SOI substrate described in the preceding embodiment modes. FIG. 10 illustrates a configuration of a microprocessor 200 as an example of the semiconductor device. The microprocessor 200 is manufactured using the SOI substrate formed according to the preceding embodiment modes as described above. This microprocessor 200 has an arithmetic logic unit (ALU) 201, an ALU controller 202, an instruction decoder 203, an interrupt controller 204, a timing controller 205, a register 206, a register controller 207, a bus interface (Bus I/F) 208, a read-only memory (ROM) 209, and a ROM interface (ROM I/F) 210.

An instruction input to the microprocessor 200 through the bus interface 208 is input to the instruction decoder 203, decoded therein, and then input to the ALU controller 202, the interrupt controller 204, the register controller 207, and the timing controller 205. The ALU controller 202, the interrupt controller 204, the register controller 207, and the timing controller 205 conduct various controls based on the decoded instruction. Specifically, the ALU controller 202 generates signals for controlling the operation of the ALU 201. While the microprocessor 200 is executing a program, the interrupt controller 204 processes an interrupt request from an external input/output device or a peripheral circuit based on its priority or a mask state. The register controller 207 generates an address of the register 206, and reads and writes data from and to the register 206 in accordance with the state of the microprocessor 200. The timing controller 205 generates signals for controlling timing of operation of the ALU 201, the ALU controller 202, the instruction decoder 203, the interrupt controller 204, and the register controller 207. For example, the timing controller 205 is provided with an internal clock generator for generating an internal clock signal CLK2 based on a reference clock signal CLK1, and supplies the internal clock signal CLK2 to the various above-mentioned circuits. Note that the microprocessor 200 illustrated in FIG. 10 is only an example in which the configuration is illustrated simply, and an actual microprocessor may have various configurations depending on the uses.

The above-described microprocessor 200 can achieve not only an increase in processing speed but also a reduction in power consumption because an integrated circuit is formed using single-crystalline semiconductor layers (SOI layers) whose crystal orientations are uniform and which are bonded to a flexible substrate having an insulating surface.

Figure 11:
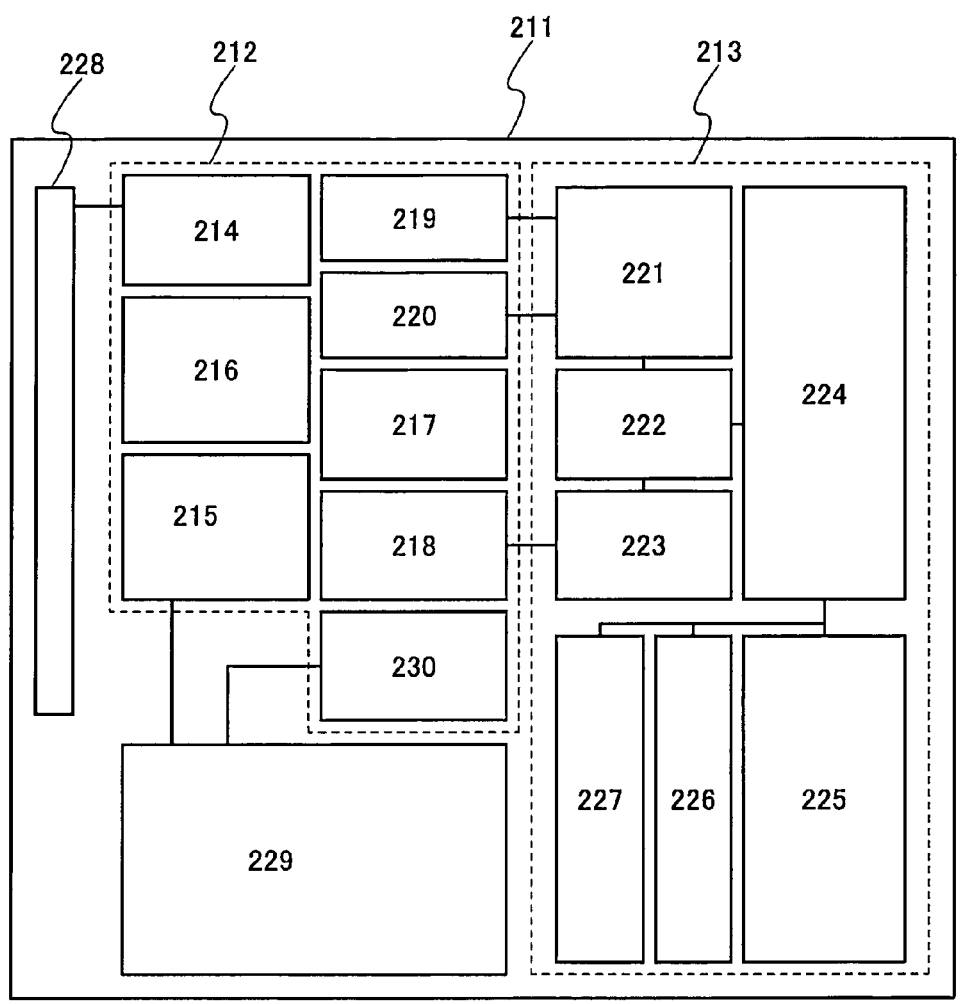
FIG. 11 is a block diagram illustrating a configuration of an RFCPU which is obtained using an SOI substrate.

Next, an example of a semiconductor device having an arithmetic function that enables contactless data transmission and reception is described with reference to FIG. 11. FIG. 11 illustrates an example of a computer that operates to transmit and receive signals to and from an external device by wireless communication (such a computer is hereinafter referred to as an RFCPU). An RFCPU 211 has an analog circuit portion 212 and a digital circuit portion 213. The analog circuit portion 212 has a resonance circuit 214 with a resonance capacitor, a rectifier circuit 215, a constant voltage circuit 216, a reset circuit 217, an oscillator circuit 218, a demodulator circuit 219, and a modulator circuit 220. The digital circuit portion 213 has an RF interface 221, a control register 222, a clock controller 223, a CPU interface 224, a central processing unit (CPU) 225, a random-access memory (RAM) 226, and a read-only memory (ROM) 227.

An example of the operation of the RFCPU 211 having such a configuration is as follows. The resonance circuit 214 generates an induced electromotive force based on a signal received by an antenna 228. The induced electromotive force is stored in a capacitor portion 229 through the rectifier circuit 215. This capacitor portion 229 is preferably formed using a capacitor such as a ceramic capacitor or an electric double layer capacitor. The capacitor portion 229 does not need to be integrated with the RFCPU 211 and it is acceptable as long as the capacitor portion 229 is mounted as a different component on a substrate having an insulating surface which forms the RFCPU 211.

The reset circuit 217 generates a signal for resetting and initializing the digital circuit portion 213. For example, the reset circuit 217 generates a signal which rises after rise in the power supply voltage with delay as a reset signal. The oscillator circuit 218 changes the frequency and duty ratio of a clock signal in response to a control signal generated by the constant voltage circuit 216. The demodulator circuit 219 formed using a low-pass filter, for example, binarizes changes in amplitude of a received amplitude-modulated (ASK) signal. The modulator circuit 220 transmits data after changing the amplitude of an amplitude-modulated (ASK) transmission signal. The modulator circuit 220 changes the amplitude of a communication signal by changing a resonance point of the resonance circuit 214. The clock controller 223 generates a control signal for changing the frequency and duty ratio of a clock signal in accordance with the power supply voltage or current consumption of the central processing unit 225. The power supply voltage is monitored by the power management circuit 230.

A signal input from the antenna 228 to the RFCPU 211 is demodulated by the demodulator circuit 219 and then decomposed into a control command, data, and the like by the RF interface 221. The control command is stored in the control register 222. The control command includes reading of data stored in the read-only memory 227, writing of data to the random-access memory 226, an arithmetic instruction to the central processing unit 225, and the like. The central processing unit 225 accesses the read-only memory 227, the random-access memory 226, and the control register 222 via the CPU interface 224. The CPU interface 224 has a function of generating an access signal for any of the read-only memory 227, the random-access memory 226, and the control register 222 based on an address the central processing unit 225 requests.

As an arithmetic method of the central processing unit 225, a method may be employed in which the read-only memory 227 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of the arithmetic processing is conducted by a dedicated arithmetic circuit and the other part of the arithmetic processing is conducted by the central processing unit 225 using a program.

The above-described RFCPU 211 can achieve not only an increase in processing speed but also a reduction in power consumption because an integrated circuit is formed using single-crystalline semiconductor layers (SOI layers) whose crystal orientations are uniform and which are bonded to a flexible substrate having an insulating surface. This makes it possible to ensure the operation for a long period of time even when the capacitor portion 229 which supplies electric power is downsized.

Figure 12:
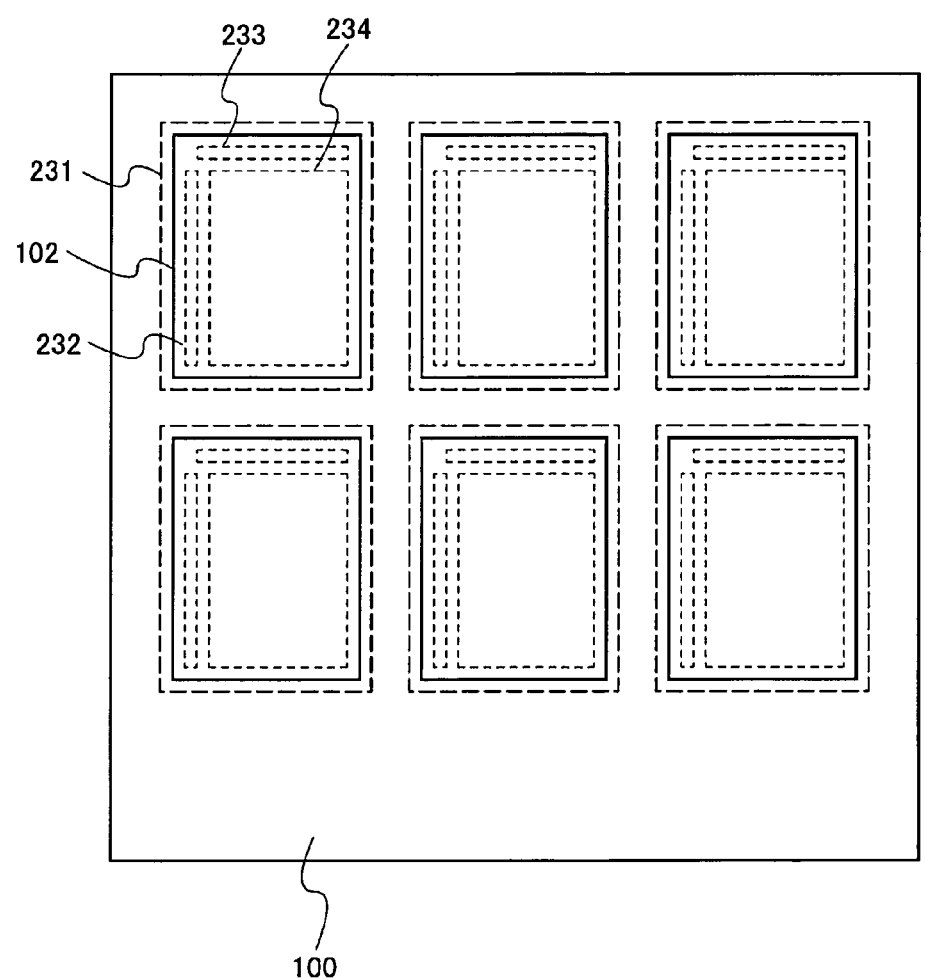
FIG. 12 is a plan view illustrating the case where SOI layers are bonded to mother glass for producing display panels.

The SOI layers 102 exemplified in FIGS. 1 to 3B can be bonded to a large-sized flexible substrate for producing a display panel. FIG. 12 illustrates the case where SOI layers 102 are bonded to a large-sized flexible substrate having an insulating surface as a supporting substrate 100. Since a plurality of display panels is cut out from the large-sized flexible substrate having an insulating surface, the SOI layers 102 are preferably bonded to formation regions of display panels 231. Since the large-sized flexible substrate having an insulating surface has a larger area than a single-crystalline semiconductor substrate, a plurality of the SOI layers 102 is preferably separately arranged as illustrated in FIG. 12. The display panel 231 includes a scanning line driver circuit region 232, a signal line driver circuit region 233, and a pixel formation region 234. The SOI layer 102 is bonded to the supporting substrate 100 (the large-sized flexible substrate having an insulating surface) so as to include these regions.

Figure 13A:
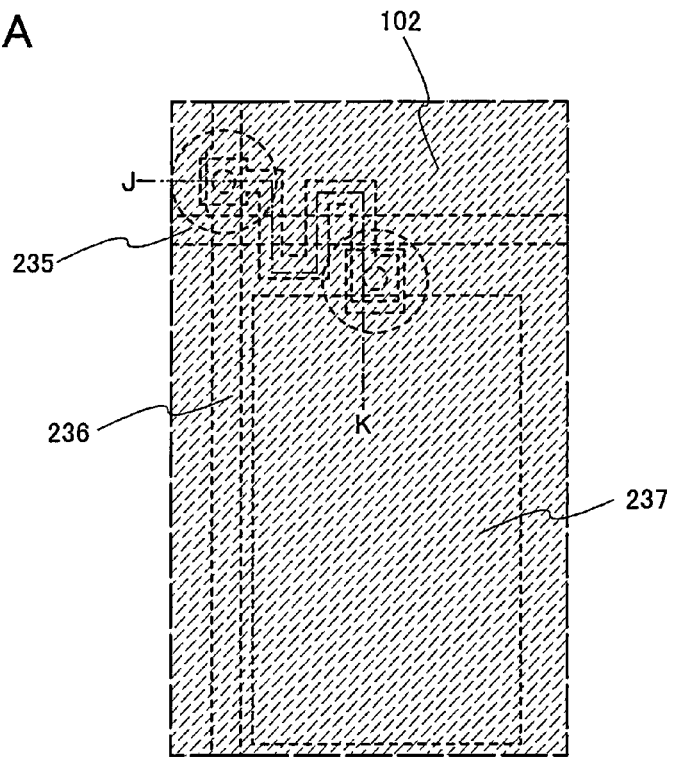
FIG. 13A is a top view and FIG. 13B is a cross-sectional view illustrating an example of a display panel in which a pixel transistor is formed using an SOI layer.
Figure 13B:
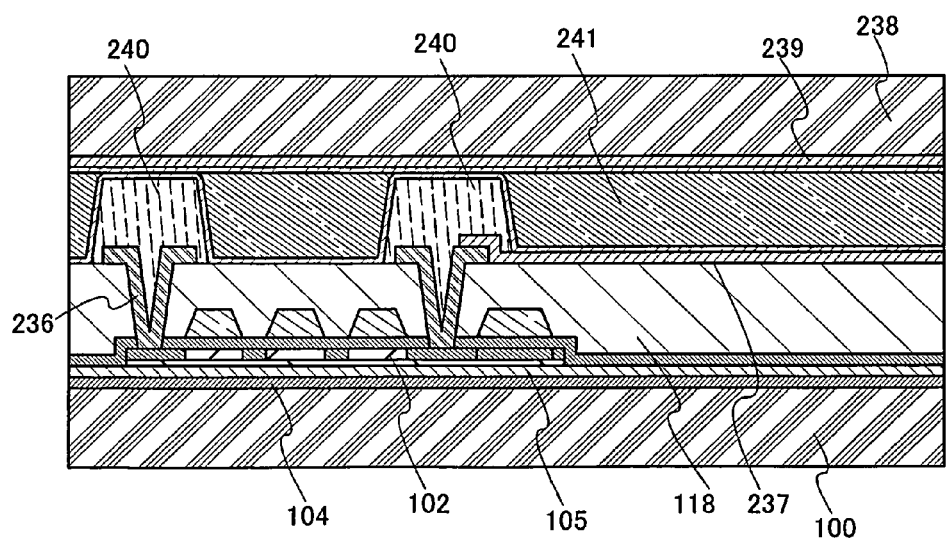

FIGS. 13A and 13B illustrate an example of a pixel of a display panel in which a pixel transistor is formed using the SOI layer 102. FIG. 13A is a plane view of the pixel in which a gate wiring 235 intersects the SOI layer 102, and a source wiring 236 and a pixel electrode 237 are connected to the SOI layer 102. FIG. 13B is a cross-sectional view taken along a line J-K in FIG. 13A.

In FIG. 13B, a silicon nitride layer and a silicon oxide layer are stacked as a barrier layer 105 over a supporting substrate 100. The SOI layer 102 is bonded to the supporting substrate 100 which is flexible with a bonding layer 104 interposed. The pixel electrode 237 is provided over an insulating layer 118. In contact holes for connecting the SOI layers 102 and the source wirings 236, columnar spacers 240 are provided so as to fill concave step portions which are generated by etching of the insulating layer 118. A counter substrate 238 is provided with a counter electrode 239 and liquid crystal layers 241 are formed in spaces formed by the columnar spacers 240.

In this manner, the SOI layers are formed over the large-sized flexible substrate having an insulating surface for producing display panels and the transistors using the SOI layers can be formed. Since the transistors formed using the SOI layers are more excellent in all the operating characteristics such as a current driving capability than those of amorphous silicon transistors, the size of the transistors can be reduced. Accordingly, an aperture ratio of the pixel portion in the display panel can be improved. Further, since a microprocessor illustrated in FIG. 10 can also be formed, the display panel can have a function of a computer. A display in which data can be input and output in a non-contact manner can also be manufactured.

(Embodiment 1)

An ion irradiation method, which is one aspect of the present invention, is considered below.

In the present invention, a single-crystalline semiconductor substrate is irradiated with ions that are derived from hydrogen (H) (hereinafter referred to as "hydrogen ion species"). More specifically, a hydrogen gas or a gas which contains hydrogen in its composition is used as a source material; a hydrogen plasma is generated; and a single-crystalline semiconductor substrate is irradiated with the hydrogen ion species in the hydrogen plasma.

(Ions in Hydrogen Plasma)

In such a hydrogen plasma as described above, hydrogen ion species such as $H^+$, $H_2^+$, and $H_3^+$ are present. Here are listed reaction equations for reaction processes (formation processes, destruction processes) of the hydrogen ion species.

$$e + H \rightarrow e + H^+ + e \quad (1)$$

$$e + H_2 \rightarrow e + H_2^+ + e \quad (2)$$

$$e + H_2 \rightarrow e + (H_2)^* \rightarrow e + H + H \quad (3)$$

$$e + H_2^+ \rightarrow e + (H_2^+)^* \rightarrow e + H^+ + H \quad (4)$$

$$H_2^+ + H_2 \rightarrow H_3^+ + H \quad (5)$$

$$H_2^+ + H_2 \rightarrow H^+ + H + H_2 \quad (6)$$

$$e + H_3^+ \rightarrow e + H^+ + H + H \quad (7)$$

$$e + H_3^+ \rightarrow H_2 + H \quad (8)$$

$$e + H_3^+ \rightarrow H + H + H \quad (9)$$

Figure 15:
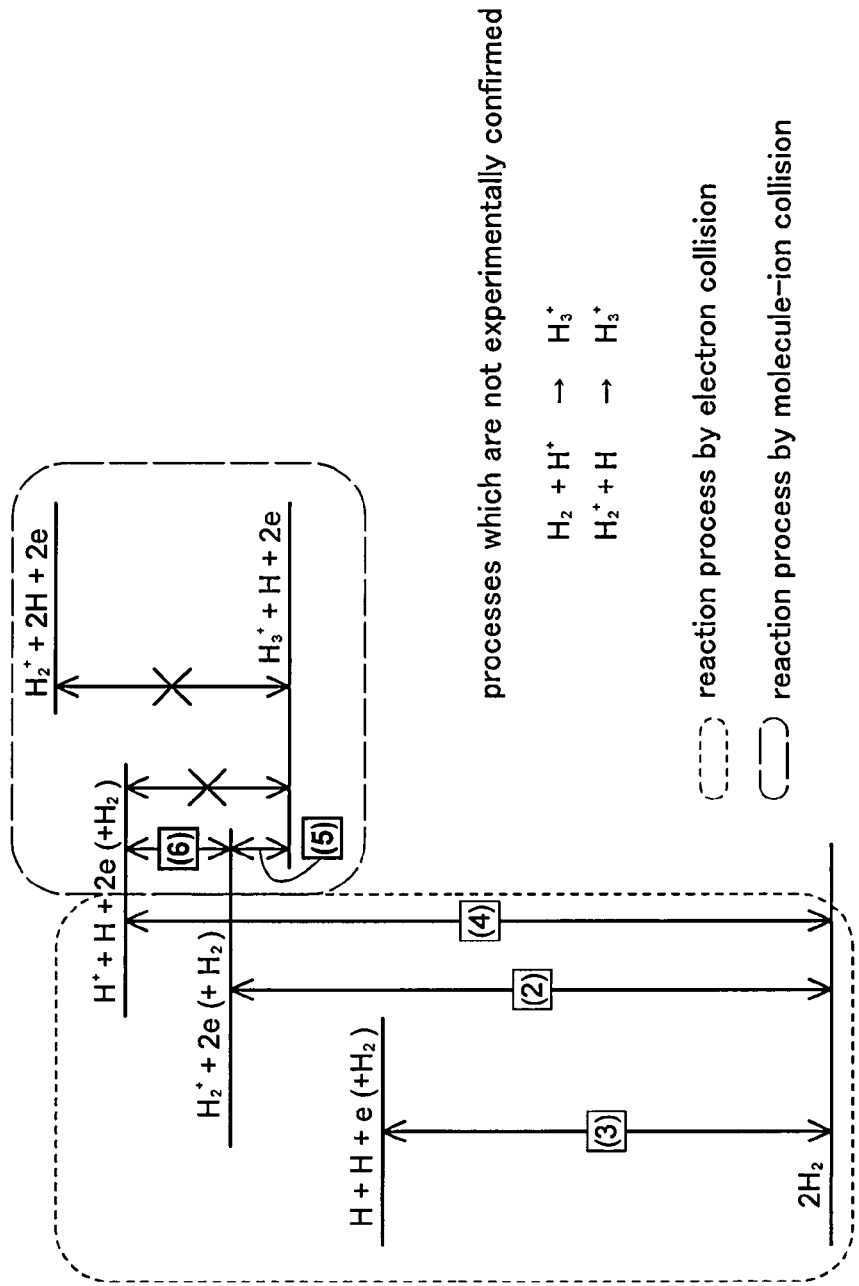
FIG. 15 is an energy diagram of hydrogen ion species.

FIG. 15 is an energy diagram which schematically shows some of the above reactions. Note that the energy diagram shown in FIG. 15 is merely a schematic diagram and does not depict the relationships of energies of the reactions exactly.

($H_3^+$ Formation Process)

As shown above, $H_3^+$ is mainly produced through the reaction process that is represented by the reaction equation (5). On the other hand, as a reaction that competes with the reaction equation (5), there is the reaction process represented by the reaction equation (6). For the amount of $H_3^+$ to increase, at the least, it is necessary that the reaction of the reaction equation (5) occur more often than the reaction of the reaction equation (6) (note that, because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in a plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than about 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy a given charged particle gains before colliding with another particle is equal to the difference between potential energies at both each ends of the period during which the charged particle moves. That is, in a situation in which a charged particle can move a long distance in an electric field without colliding with another particle, the kinetic energy (or the average thereof) of the charged particle tends to be higher than that in a situation in which the charged particle cannot. Such a tendency toward an increase in kinetic energy of a charged particle can be shown in a situation in which the mean free path of a particle is long, that is, in a situation in which pressure is low.

Even in a situation in which the mean free path is short, the kinetic energy of a charged particle is high if the charged particle can gain a high amount of kinetic energy while traveling through the path. That is, it can be said that, even in the situation in which the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation in which the pressure inside the chamber is low and the kinetic energy of $H_2^+$ is low in a situation in which the pressure inside the chamber is high. That is, because the reaction of the reaction equation (6) is the main reaction in the situation in which the pressure inside the chamber is low, the amount of $H_3^+$ tends to be decreased, and because the reaction of the reaction equation (5) is the main reaction in the situation in which the pressure inside the chamber is high, the amount of $H_3^+$ tends to be increased. In addition, in a situation in which an electric field in a plasma generation region is high, that is, in a situation in which the potential difference between given two points is large, the kinetic energy of $H_2^+$ is high, and in the opposite situation, the kinetic energy of $H_2^+$ is low. That is, because the reaction of the reaction equation (6) is the main reaction in the situation in which the electric field is high, the amount of $H_3^+$ tends to be decreased, and because the reaction of the reaction equation (5) is the main reaction in a situation in which the electric field is low, the amount of $H_3^+$ tends to be increased.

(Differences Depending on Ion Source)

Figure 16:
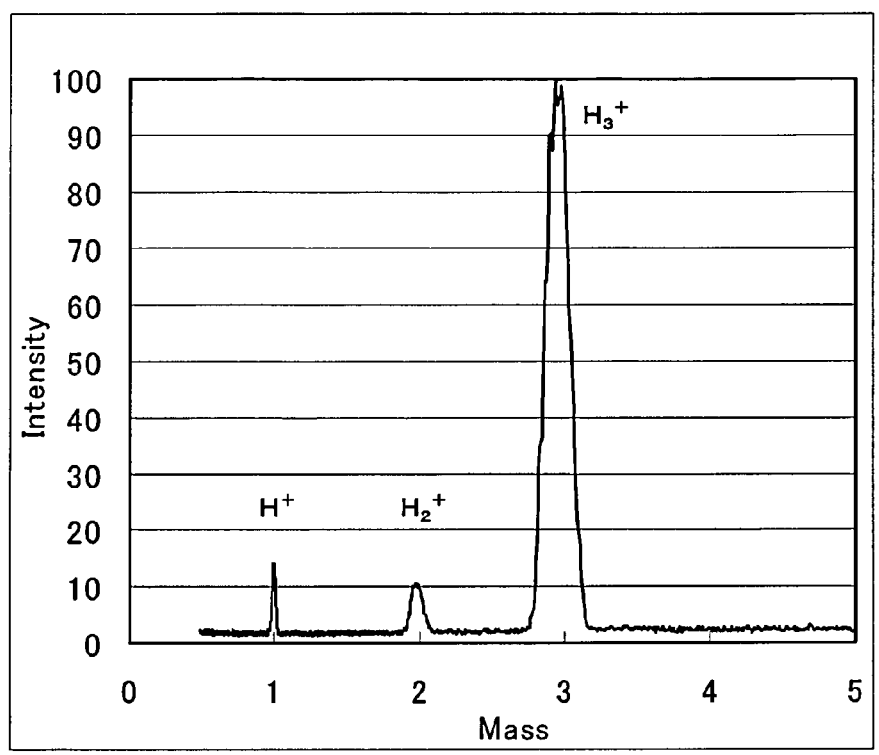
FIG. 16 is a diagram showing the results of ion mass spectrometry.

Here, an example, in which the proportions of ion species (particularly, the proportion of $H_3^+$) are different, is described. FIG. 16 is a graph showing the results of mass spectrometry of ions that are generated from a 100% hydrogen gas (with the pressure of an ion source of $4.7 \times 10^{-2}$ Pa). Note that this mass spectrometry was performed by measurement of ions that were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 16, the number of ions with different masses is expressed as a relative proportion where the number of ions with a mass of 3 is defined as 100. It can be seen from FIG. 16 that the ratio between ion species that are generated from the ion source, i.e., the ratio between $H^+$, $H_2^+$, and $H_3^+$, is about 1:1:8. Note that ions at such a ratio can also be generated by an ion doping apparatus which has a plasma source portion (ion source) that generates a plasma, an extraction electrode that extracts an ion beam from the plasma, and the like.

Figure 17:
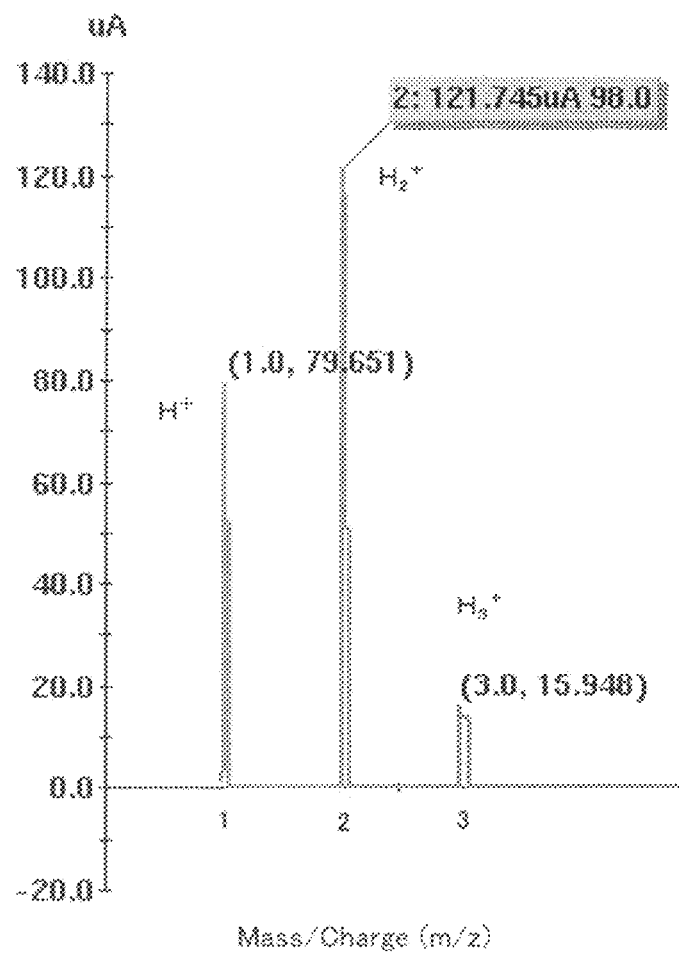
FIG. 17 is a diagram showing the results of ion mass spectrometry.

FIG. 17 is a graph showing the results of mass spectrometry of ions that are generated from $PH_3$ when an ion source different from that for the case of FIG. 16 is used and the pressure of the ion source is about $3 \times 10^{-3}$ Pa. The results of this mass spectrometry focus on the hydrogen ion species. In addition, the mass spectrometry was performed by measurement of ions that were extracted from the ion source. As in FIG. 16, the horizontal axis represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be seen from FIG. 17 that the ratio between ion species in a plasma, i.e., the ratio between $H^+$, $H_2^+$, and $H_3^+$, is about 37:56:7. Note that, although FIG. 17 shows the data obtained when the source gas is $PH_3$, the ratio between the hydrogen ion species is about the same when a 100% hydrogen gas is used as a source gas, as well.

In the case of the ion source from which the data shown in FIG. 17 is obtained, $H_3^+$, of $H^+$, $H_2^+$, and $H_3^+$, is generated at a proportion of only about 7%. On the other hand, in the case of the ion source from which the data shown in FIG. 16 is obtained, the proportion of $H_3^+$ can be up to 50% or higher (under the aforementioned conditions, about 80%). This is thought to result from the pressure and electric field inside a chamber, which is clearly shown in the above consideration.

($H_3^+$ Irradiation Mechanism)

When a plasma that contains a plurality of ion species as shown in FIG. 16 is generated and a single-crystalline semiconductor substrate is irradiated with the generated ion species without any mass separation being performed, the surface of the single-crystalline semiconductor substrate is irradiated with each of $H^+$, $H_2^+$, and $H_3^+$ ions. In order to reproduce the mechanism, from the irradiation with ions to the formation of an ion-introduced region, the following five types of models are considered.

Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

(Comparison of Simulation Results with Measured Values)

Based on the above models, the irradiation of an Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that, for the calculation, a calculation based on Model 2 was performed with the $H_2^+$ replaced by $H^+$ that has twice the mass. In addition, a calculation based on Model 4 was performed with the $H_3^+$ replaced by $H^+$ that has three times the mass. Furthermore, a calculation based on Model 3 was performed with the $H_2^+$ replaced by $H^+$ that has half the kinetic energy, and a calculation based on Model 5, with the $H_3^+$ replaced by $H^+$ that has one-third the kinetic energy.

Note that SRIM is software intended for amorphous structures, but SRIM can be applied to cases where irradiation with the hydrogen ion species is performed with high energy at a high dose. This is because the crystal structure of an Si substrate changes into a non-single-crystalline structure due to the collision of the hydrogen ion species with Si atoms.

Figure 18:
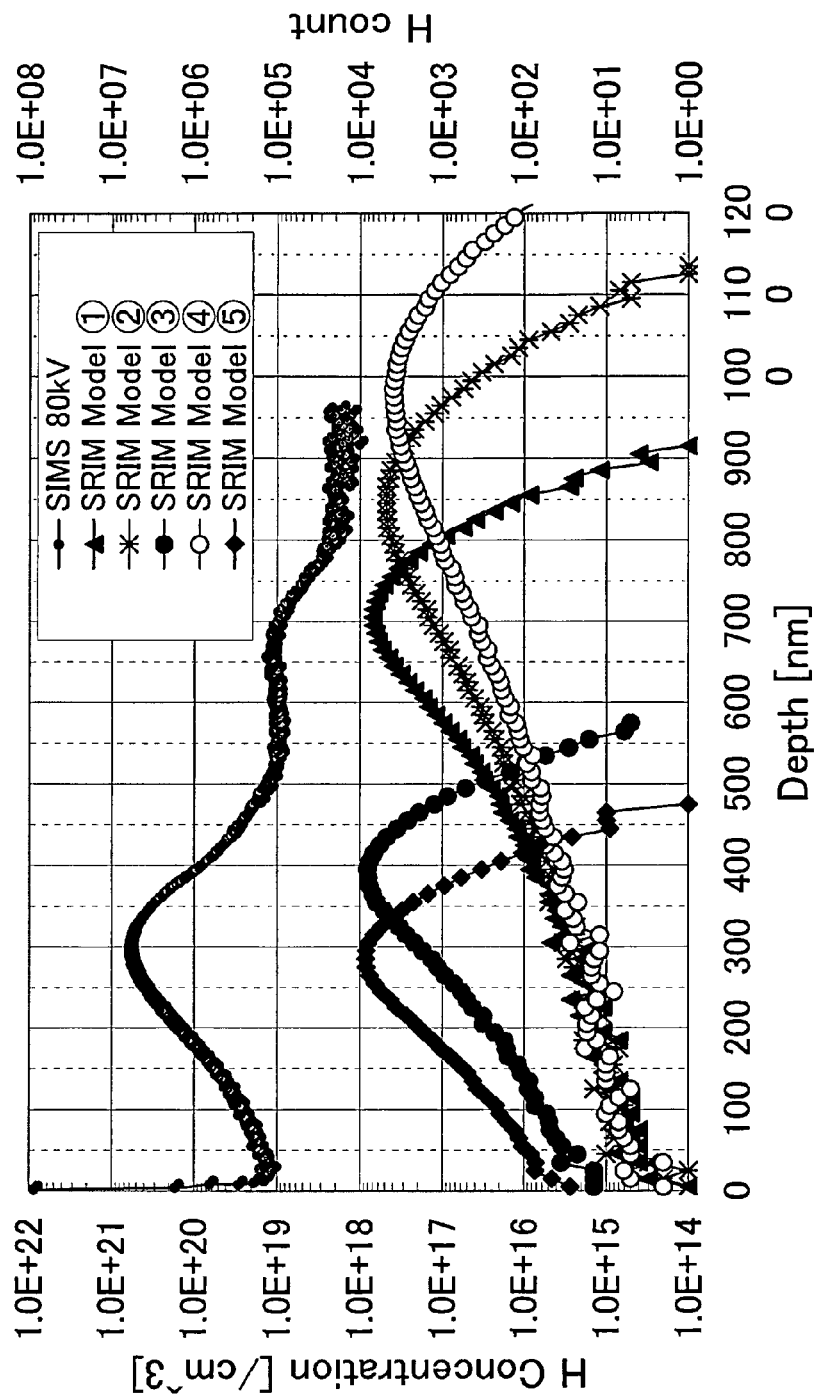
FIG. 18 is a diagram showing the profile (measured values and calculated values) of hydrogen in the depth direction when the accelerating voltage is 80 keV.

FIG. 18 shows the calculation results obtained when irradiation with the hydrogen ion species (irradiation with 100,000 atoms for H) is performed using Models 1 to 5. FIG. 18 also shows the hydrogen concentration (secondary ion mass spectrometry (SIMS) data) in an Si substrate irradiated with the hydrogen ion species of FIG. 16. The results of calculations performed using Models 1 to 5 are expressed on the vertical axis (right axis) as the number of hydrogen atoms, and the SIMS data is expressed on the vertical axis (left axis) as the density of hydrogen atoms. The horizontal axis represents depth from the surface of an Si substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is on the order of kiloelectron volts whereas the H—H bond energy is only about several electron volts, it is thought that the contribution of each of Models 2 and 4 is small because $H_2^+$ and $H_3^+$ mostly split into $H^+$ or H by colliding with Si atoms.

Figure 19:
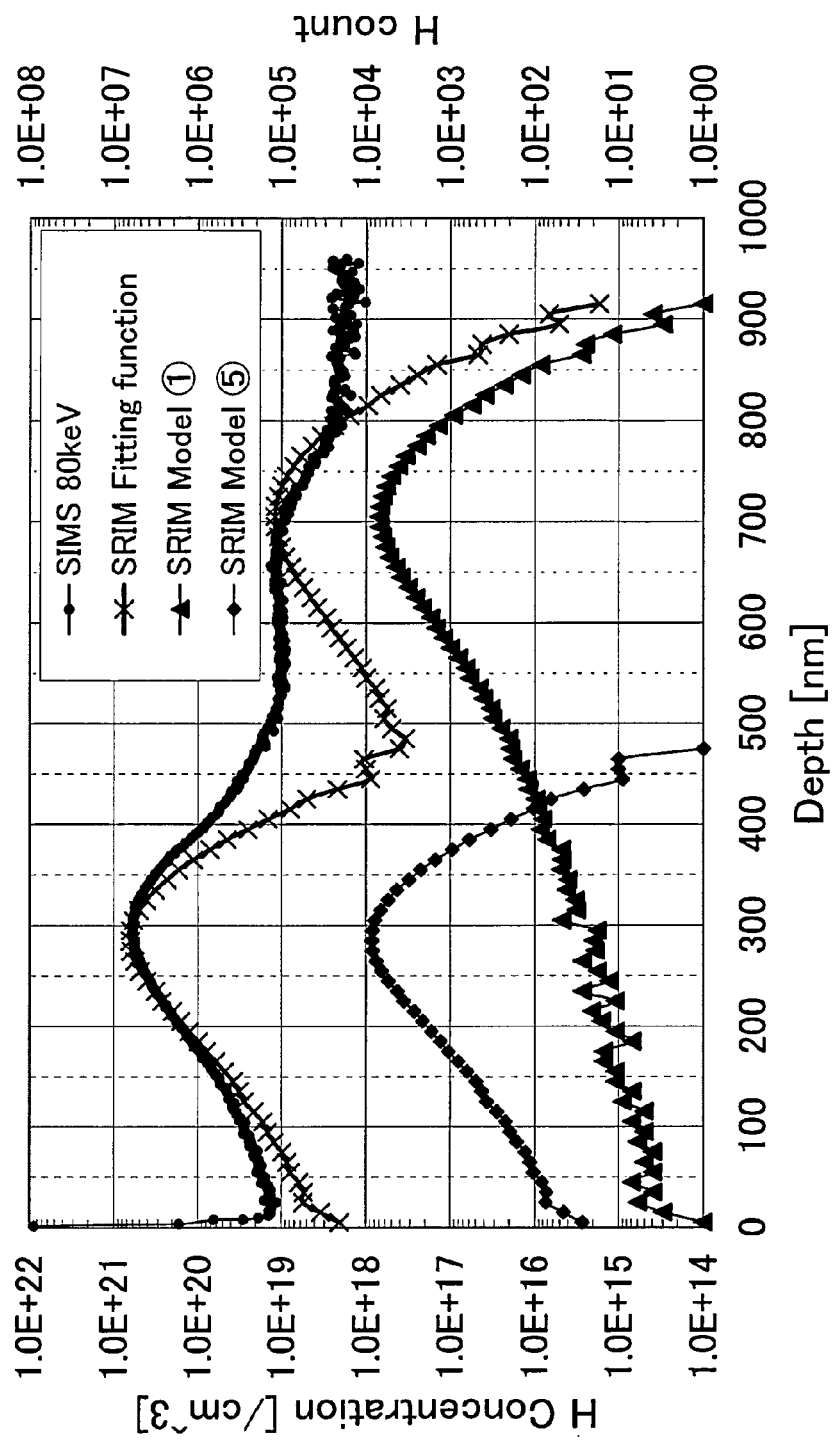
FIG. 19 is a diagram showing the profile (measured values, calculated values, and fitting functions) of hydrogen in the depth direction when the accelerating voltage is 80 keV.
Figure 20:
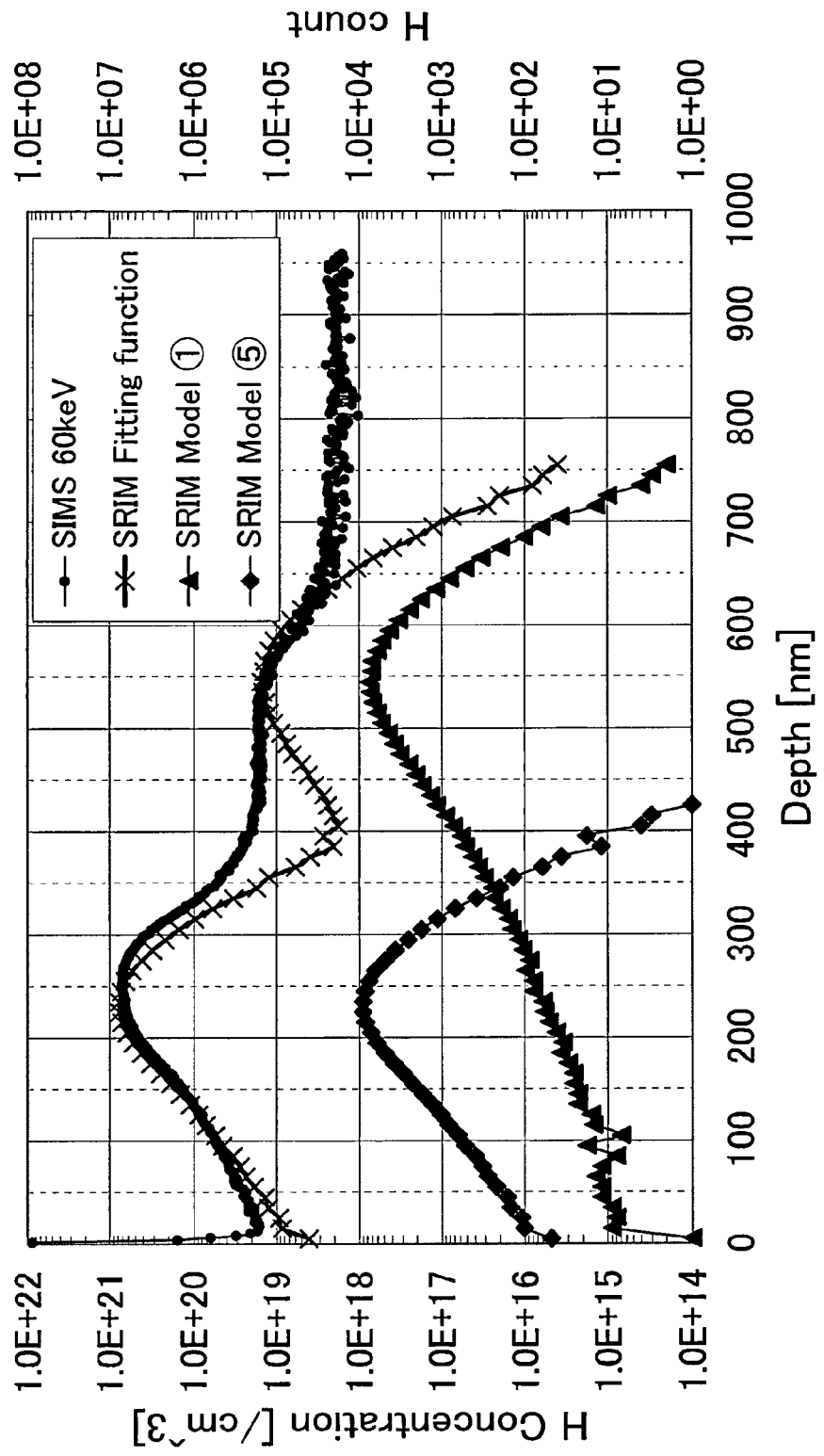
FIG. 20 is a diagram showing the profile (measured values, calculated values, and fitting functions) of hydrogen in the depth direction when the accelerating voltage is 60 keV.
Figure 21:
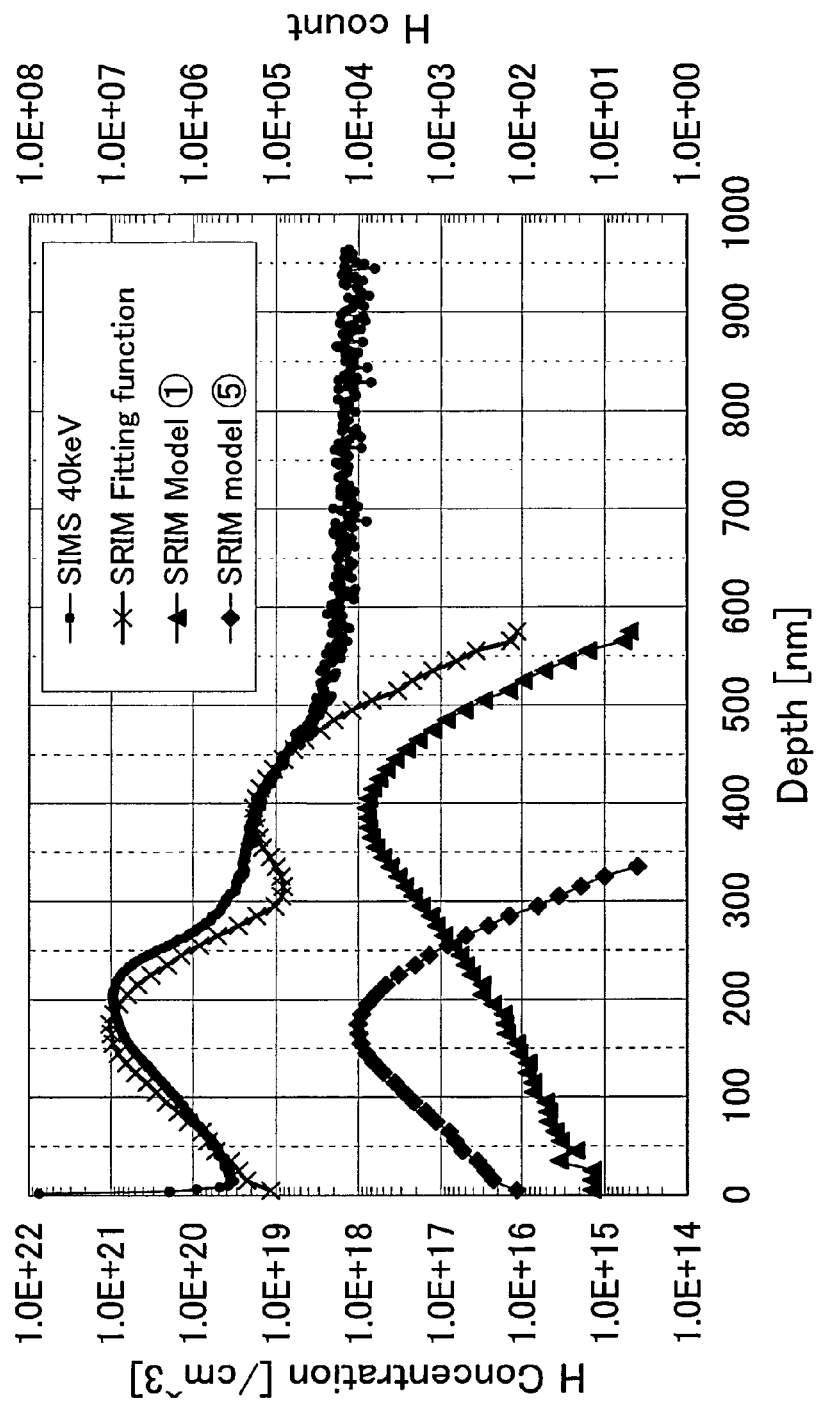
FIG. 21 is a diagram showing the profile (measured values, calculated values, and fitting functions) of hydrogen in the depth direction when the accelerating voltage is 40 keV.

Accordingly, Models 2 to 4 will not be considered hereinafter. FIGS. 19 to 21 each show the calculation results obtained when irradiation with the hydrogen ion species (irradiation with 100,000 atoms for H) is performed using Models 1 and 5. FIGS. 19 to 21 also each show the hydrogen concentration (SIMS data) in an Si substrate irradiated with the hydrogen ion species of FIG. 16, and the simulation results fitted to the SIMS data (hereinafter referred to as a fitting function). Here, FIG. 19 shows the case where the accelerating voltage is 80 keV; FIG. 20, the case where the accelerating voltage is 60 keV; and FIG. 21, the case where the accelerating voltage is 40 keV. Note that the results of calculations performed using Models 1 and 5 are expressed on the vertical axis (right axis) as the number of hydrogen atoms, and the SIMS data and the fitting function are expressed on the vertical axis (left axis) as the density of hydrogen atoms. The horizontal axis represents depth from the surface of an Si substrate.

The fitting function is obtained using the calculation formula given below, in consideration of Models 1 and 5. Note that, in the calculation formula, X and Y represent fitting parameters and V represents volume.

(Fitting Function)=$X/V$×(Data of Model 1)+$Y/V$×(Data of Model 5)

In consideration of the ratio between ion species used for actual irradiation ($H^+:H_2^+:H_3^+$ is about 1:1:8), the contribution of $H_2^+$ (i.e., Model 3) should also be considered; however, Model 3 is excluded from the consideration given here for the following reasons:

Because the amount of hydrogen introduced through the irradiation process represented by Model 3 is lower than that introduced through the irradiation process of Model 5, there is no significant influence even if Model 3 is excluded from the consideration (no peak appears in the SIMS data either).

Model 3, the peak position of which is close to that of Model 5, is likely to be obscured by channeling (movement of atoms due to crystal lattice structure) that occurs in Model 5. That is, it is difficult to estimate fitting parameters for Model 3. This is because this simulation assumes amorphous Si and the influence due to crystallinity is not considered.

FIG. 22 lists the aforementioned fitting parameters. At any of the accelerating voltages, the ratio of the amount of H introduced according to Model 1 to that introduced according to Model 5 is about 1:42 to 1:45 (the amount of H in Model 5, when the amount of H in Model 1 is defined as 1, is about 42 to 45), and the ratio of the number of ions used for irradiation, $H^+$ (Model 1) to that of $H_3^+$ (Model 5) is about 1:14 to 1:15 (the amount of $H_3^+$ in Model 5, when the amount of $H^+$ in Model 1 is defined as 1, is about 14 to 15). Considering that Model 3 is not considered and the calculation assumes amorphous Si, it can be said that values close to that of the ratio between ion species used for actual irradiation ($H^+:H_2^+:H_3^+$ is about 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$ as shown in FIG. 16. For example, because $H_3^+$ splits into $H^+$, H, or the like to be introduced into a substrate, ion introduction efficiency can be improved compared to the case of irradiation mainly with $H^+$ or $H_2^+$. This leads to an improvement in semiconductor substrate production efficiency. In addition, because the kinetic energy of $H^+$ or H after $H_3^+$ splits similarly tends to be low, $H_3^+$ is suitable for manufacture of thin semiconductor layers.

Note that, in this specification, a method is described in which an ion doping apparatus that is capable of irradiation with the hydrogen ion species as shown in FIG. 16 is used in order to efficiently perform irradiation with $H_3^+$. Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in production efficiency can be obtained. On the other hand, if first priority is given to irradiation with $H_3^+$, there is no need to interpret the present invention as being limited to the use of an ion irradiation apparatus.

This application is based on Japanese Patent Application Serial No. 2007-133546 filed with Japan Patent Office on May 18, 2007, the entire contents of which are hereby incorporated by reference.

What is claimed is:

1. A method for manufacturing an SOI substrate, comprising the steps of:
   forming a brittle layer in a single-crystalline semiconductor substrate so that a single-crystalline semiconductor layer is provided on the brittle layer;
   forming a cap layer over the single-crystalline semiconductor layer;
   bonding the single-crystalline semiconductor layer and a supporting substrate to each other with the cap layer interposed therebetween; and
   separating the single-crystalline semiconductor layer from the single-crystalline semiconductor substrate at the brittle layer so that the single-crystalline semiconductor layer is formed over the supporting substrate with the cap layer interposed therebetween,
   wherein a thickness from a top surface to a bottom surface of the single-crystalline semiconductor substrate is 50 μm or less, and
   wherein the top surface and the bottom surface of the single-crystalline semiconductor substrate are exposed to air.

2. The method for manufacturing an SOI substrate according to claim 1, wherein the brittle layer is formed by irradiation with hydrogen or a rare gas using an ion doping method or an ion implantation method.

3. The method for manufacturing an SOI substrate according to claim 1, wherein the cap layer is a nitrogen-containing insulating layer or a silicon oxide layer.

4. The method for manufacturing an SOI substrate according to claim 1, wherein the supporting substrate is a plastic substrate.

5. The method for manufacturing an SOI substrate according to claim 1, further comprising a step of polishing a surface of the single-crystalline semiconductor layer after the separating step.

6. The method for manufacturing an SOI substrate according to claim 1, wherein the single-crystalline semiconductor layer has a thickness of 10-200 nm.

7. A method for manufacturing a semiconductor device, comprising the steps of:
   forming a brittle layer in a single-crystalline semiconductor substrate so that a single-crystalline semiconductor layer is provided on the brittle layer;
   forming a cap layer over the single-crystalline semiconductor layer;
   bonding the single-crystalline semiconductor layer and a supporting substrate to each other with the cap layer interposed therebetween; and
   separating the single-crystalline semiconductor layer from the single-crystalline semiconductor substrate at the brittle layer so that the single-crystalline semiconductor layer is formed over the supporting substrate with the cap layer interposed therebetween;
   forming a gate insulating layer over the single-crystalline semiconductor layer;
   forming a gate electrode over the gate insulating layer;
   introducing an impurity to the single-crystalline semiconductor layer using the gate electrode as a mask;
   forming an interlayer insulating layer over the gate electrode;
   forming a contact hole which reaches the single-crystalline semiconductor layer in the interlayer insulating layer; and
   forming a conductive layer electrically connected to the single-crystalline semiconductor layer through the contact hole over the interlayer insulating layer,
   wherein a thickness from a top surface to a bottom surface of the single-crystalline semiconductor substrate is 50 μm or less, and
   wherein the top surface and the bottom surface of the single-crystalline semiconductor substrate are exposed to air.

8. The method for manufacturing a semiconductor device according to claim 7, wherein the brittle layer is formed by irradiation with hydrogen or a rare gas using an ion doping method or an ion implantation method.

9. The method for manufacturing a semiconductor device according to claim 7, wherein the cap layer is a nitrogen-containing insulating layer or a silicon oxide layer.

10. The method for manufacturing a semiconductor device according to claim 7, wherein the supporting substrate is a plastic substrate.

11. The method for manufacturing a semiconductor device according to claim 7, further comprising a step of polishing a surface of the single-crystalline semiconductor layer after the separating step.

12. The method for manufacturing a semiconductor device according to claim 7, wherein the single-crystalline semiconductor layer has a thickness of 10-200 nm.

13. A method for manufacturing an SOI substrate, comprising the steps of:
   forming a brittle layer in a single-crystalline semiconductor substrate so that a single-crystalline semiconductor layer is provided on the brittle layer;
   forming a cap layer over the single-crystalline semiconductor layer;
   forming a bonding layer over the cap layer;
   bonding the single-crystalline semiconductor layer and a supporting substrate to each other with the cap layer and the bonding layer interposed therebetween; and
   separating the single-crystalline semiconductor layer from the single-crystalline semiconductor substrate at the brittle layer so that the single-crystalline semiconductor layer is formed over the supporting substrate with the cap layer and the bonding layer interposed therebetween,
   wherein a thickness from a top surface to a bottom surface of the single-crystalline semiconductor substrate is 50 μm or less, and
   wherein the top surface and the bottom surface of the single-crystalline semiconductor substrate are exposed to air.

14. The method for manufacturing an SOI substrate according to claim 13, wherein the brittle layer is formed by irradiation with hydrogen or a rare gas using an ion doping method or an ion implantation method.

15. The method for manufacturing an SOI substrate according to claim 13, wherein the cap layer is a nitrogen-containing insulating layer or a silicon oxide layer.

16. The method for manufacturing an SOI substrate according to claim 13, wherein the cap layer is thicker than the bonding layer.

17. The method for manufacturing an SOI substrate according to claim 13, wherein the supporting substrate is a plastic substrate.

18. The method for manufacturing an SOI substrate according to claim 13, further comprising a step of polishing a surface of the single-crystalline semiconductor layer after the separating step.

19. The method for manufacturing an SOI substrate according to claim 13, wherein the single-crystalline semiconductor layer has a thickness of 10-200 nm.

20. A method for manufacturing a semiconductor device, comprising the steps of:
- forming a brittle layer in a single-crystalline semiconductor substrate so that a single-crystalline semiconductor layer is provided on the brittle layer;
- forming a cap layer over the single-crystalline semiconductor layer;
- forming a bonding layer over the cap layer;
- bonding the single-crystalline semiconductor layer and a supporting substrate to each other with the cap layer and the bonding layer interposed therebetween; and
- separating the single-crystalline semiconductor layer from the single-crystalline semiconductor substrate at the brittle layer so that the single-crystalline semiconductor layer is formed over the supporting substrate with the cap layer and the bonding layer interposed therebetween;
- forming a gate insulating layer over the single-crystalline semiconductor layer;
- forming a gate electrode over the gate insulating layer;
- introducing an impurity to the single-crystalline semiconductor layer using the gate electrode as a mask;
- forming an interlayer insulating layer over the gate electrode;
- forming a contact hole which reaches the single-crystalline semiconductor layer in the interlayer insulating layer; and
- forming a conductive layer electrically connected to the single-crystalline semiconductor layer through the contact hole over the interlayer insulating layer, wherein a thickness from a top surface to a bottom surface of the single-crystalline semiconductor substrate is 50 μm or less, and wherein the top surface and the bottom surface of the single-crystalline semiconductor substrate are exposed to air.

21. The method for manufacturing a semiconductor device according to claim 20, wherein the brittle layer is formed by irradiation with hydrogen or a rare gas using an ion doping method or an ion implantation method.

22. The method for manufacturing a semiconductor device according to claim 20, wherein the cap layer is a nitrogen-containing insulating layer or a silicon oxide layer.

23. The method for manufacturing a semiconductor device according to claim 20, wherein the cap layer is thicker than the bonding layer.

24. The method for manufacturing a semiconductor device according to claim 20, wherein the supporting substrate is a plastic substrate.

25. The method for manufacturing a semiconductor device according to claim 20, further comprising a step of polishing a surface of the single-crystalline semiconductor layer after the separating step.

26. The method for manufacturing a semiconductor device according to claim 20, wherein the single-crystalline semiconductor layer has a thickness of 10-200 nm.

* * * * *